(12) United States Patent
Kohtani et al.

(10) Patent No.: US 10,680,154 B2
(45) Date of Patent: Jun. 9, 2020

(54) THERMOELECTRIC CONVERSION MODULE, METHOD FOR PRODUCING SAME, THERMOELECTRIC POWER GENERATION SYSTEM, AND METHOD FOR PRODUCING SAME

(71) Applicant: E-ThermoGentek Co., Ltd., Kyoto (JP)

(72) Inventors: Nobuyuki Kohtani, Kyoto (JP); Michio Okajima, Kyoto (JP); Keiichi Ohata, Kyoto (JP); Shutaro Nambu, Kyoto (JP)

(73) Assignee: E-ThermoGentek Co., Ltd., Kyoto (JP)

( * ) Notice: Subject to any disclaimer, the term of this patent is extended or adjusted under 35 U.S.C. 154(b) by 100 days.

(21) Appl. No.: 15/569,683

(22) PCT Filed: Apr. 22, 2016

(86) PCT No.: PCT/JP2016/062760
§ 371 (c)(1),
(2) Date: Dec. 5, 2017

(87) PCT Pub. No.: WO2016/175147
PCT Pub. Date: Nov. 3, 2016

(65) Prior Publication Data
US 2018/0130938 A1     May 10, 2018

(30) Foreign Application Priority Data

Apr. 27, 2015  (JP) .................................. 2015-102251

(51) Int. Cl.
*H01L 35/32* (2006.01)
*H01L 35/30* (2006.01)
(Continued)

(52) U.S. Cl.
CPC ............ *H01L 35/325* (2013.01); *H01L 35/02* (2013.01); *H01L 35/08* (2013.01); *H01L 35/10* (2013.01);
(Continued)

(58) Field of Classification Search
CPC ...................................................... H01L 35/325
See application file for complete search history.

(56) References Cited

U.S. PATENT DOCUMENTS

| 6,410,971 B1 | 6/2002 | Otey |
| 2005/0121065 A1* | 6/2005 | Otey ....................... H01L 35/30 136/205 |

(Continued)

FOREIGN PATENT DOCUMENTS

| JP | 2009-267316 A | 11/2009 |
| JP | 2011-193013 A | 9/2011 |

(Continued)

OTHER PUBLICATIONS

International Search Report for corresponding International Application No. PCT/JP2016/062760, dated Aug. 9, 2016.

*Primary Examiner* — Dustin Q Dam
(74) *Attorney, Agent, or Firm* — Renner, Otto, Boisselle and Sklar, LLP

(57) ABSTRACT

In a known method in which a cooling pipe that is fixed and rigid is used, variation in a distance from the center of an exhaust heat pipe to the outer surface of a thermoelectric conversion module, variation in the radius of curvature of the curved surface of a cooling pipe, and other factors produce a gap between the outer surface of the thermoelectric conversion module and the inside surface of the cooling pipe. The gap prevents the achievement of desired cooling performance and the improvement of power generation efficiency.

(Continued)

A thermoelectric conversion module of the present invention includes two flexible substrates each made of a thin resin film and having mounting lands formed thereon, and a plurality of thermoelectric elements mounted on the mounting lands at high density, wherein one of the two flexible substrate has a plurality of slits to make the module easy to bend.

6 Claims, 16 Drawing Sheets

(51) Int. Cl.
*H01L 35/34* (2006.01)
*H02N 11/00* (2006.01)
*H01L 35/02* (2006.01)
*H01L 35/08* (2006.01)
*H01L 35/10* (2006.01)

(52) U.S. Cl.
CPC .............. *H01L 35/30* (2013.01); *H01L 35/32* (2013.01); *H01L 35/34* (2013.01); *H02N 11/00* (2013.01)

(56) References Cited

U.S. PATENT DOCUMENTS

| | | |
|---|---|---|
| 2012/0204557 A1 | 8/2012 | Jebasinski et al. |
| 2014/0116035 A1 | 5/2014 | An et al. |

FOREIGN PATENT DOCUMENTS

| | | |
|---|---|---|
| JP | 2012-167671 A | 9/2012 |
| JP | 2013-033810 A | 2/2013 |
| JP | 5228160 | 3/2013 |
| JP | 2014-060333 A | 4/2014 |
| JP | 2014-086713 A | 5/2014 |
| WO | WO 2013/065856 A1 | 5/2013 |

\* cited by examiner

THERMOELECTRIC CONVERSION MODULE, METHOD FOR PRODUCING SAME, THERMOELECTRIC POWER GENERATION SYSTEM, AND METHOD FOR PRODUCING SAME

TECHNICAL FIELD

The present invention relates to a thermoelectric conversion module which interconverts heat (a temperature differential) and electricity, in particular, a module for generating power. The present invention relates also to a method for producing the module, and a thermoelectric power generation system including the module.

BACKGROUND ART

In the present industrial society, an enormous amount of waste heat, which corresponds to 60% or more of the total amount of supplied primary energy, is exhausted to the natural environment mainly from factories, power plants, ironworks, automobiles, buildings, illuminators, ships, and so on. It is estimated that 75% or more of the waste heat is exhausted in the forms of hot water and gas that have a temperature of 250° C. or less. Thermoelectric power generation refers to generating power from such wasted and discharged heat. The thermoelectric power generation is therefore highly useful for protecting the Earth's environment. The waste heat is generally transferred through exhaust heat pipes such as cylindrical exhaust pipes and cylindrical wastewater pipes. In order to utilize the waste heat simply and efficiently as a heat source for the thermoelectric power generation, a thermoelectric conversion module needs to be flexible so as to be capable of being in contact with a curved outer surface of an exhaust heat pipe. Heat sources for the thermoelectric power generation have low temperature, and resultant temperature differential is small. This makes power generation efficiency low. Therefore, a module has to have low internal resistance in order to function as a power generation module. Thus, a module needs to include a large number of low-resistance thermoelectric elements mounted in an area as small as possible, and to be manufacturable at a low cost with good mass productivity. Further, in order to provide the thermoelectric elements with a largest possible temperature differential, a mounting substrate and other components of the module need to have low thermal resistance, and the module needs to have low contact thermal resistance when mounted to a pipe. Japanese Patent No. 5228160 discloses an example of known flexible thermoelectric conversion modules.

CITATION LIST

Patent Documents

PATENT DOCUMENT 1: Japanese Patent No. 5228160

Patent Document 1 discloses a thermoelectric power generation system. As shown in FIGS. 29, 30, 31, and 32, this thermoelectric generation system includes multiple thermoelectric conversion modules each including: a substrate 1 made of a thin resin film and having mounting lands 2 formed thereon; and micro bulk thermoelectric element chips 3 mounted on the mounting lands 2 at high density. Each thermoelectric conversion module is flexible due to its configuration in which the substrate 1 is slightly bent at gaps between adjacent ones of the mounting lands. The thermoelectric generation system further includes a means for water-cooling the outer sides of the multiple modules mounted on the outer surface of a hot wastewater pipe. The technique of Patent Document 1 makes it possible to arrange the thermoelectric element modules arranged along, and in contact with, the curved surface of a wastewater pipe. Reference numeral 4 denotes an interconnect, and reference numeral 5 denotes a wastewater pipe.

SUMMARY OF THE INVENTION

Technical Problem

However, according to the technique of Patent Document 1, the thermoelectric elements 3 on one side of the substrate are connected together by a conductive paste alone. If the conductive paste has an uneven surface, variation arises not only in the electric resistance, but also in heat conduction from the surface of the conductive paste. In addition, it is necessary to fill the gaps between the thermoelectric elements 3 with a resin because the conductive paste entails the risk of hanging down between the thermoelectric elements 3 to be broken. Furthermore, although both surfaces of the flexible substrate 1 are provided with a metal, the metal on one of the surfaces is unconnected to the metal on the other. A surface of the module is in contact with the wastewater pipe via copper foil only. Therefore, if a gap is produced between the module and the wastewater pipe, heat may be conducted insufficiently.

FIG. 33 shows a heat exchanger which has been used in an attempt to carry out a method for cooling a thermoelectric conversion module. This heat exchanger includes multiple cooling pipes 6 or a helical cooling pipe 6 which is/are curved along a curved surface, of a wastewater pipe 5, orthogonal to the pipe axial direction of the wastewater pipe 5, and which is/are arranged over the outer periphery of a thermoelectric conversion module 7. In this method in which the cooling pipe or pipes 6 that is/are rigid and fixed, variation in the distance from the center of the wastewater pipe 5 to the outer surface of the thermoelectric conversion module 7, variation in the radius of curvature of the curve of the cooling pipe or pipes 6, and other factors produce a gap 8 between the outer surface of the thermoelectric conversion module 7, and the inside surface of the cooling pipe or pipes 6. The gap 8 prevents the achievement of desired cooling performance and the improvement of power generation efficiency. Reference numeral 9 denotes cooling water.

Solution to the Problem

A thermoelectric conversion module of the present invention includes two flexible substrates each made of a thin resin film and having mounting lands formed thereon, and a plurality of thermoelectric elements mounted on the mounting lands at high density, wherein one of the two flexible substrate has a plurality of slits to make the module easy to bend.

The mounting lands of the two flexible substrates connect the thermoelectric elements together, thereby reducing electric resistance and improving thermoelectric conversion efficiency.

A thermally conductive sheet is provided on an outer surface of at least the other of the two flexible substrates, and the thermally conductive sheet is in contact with an exhaust heat pipe, thereby efficiently transmitting heat from the exhaust heat pipe.

In the thermoelectric conversion module, each flexible substrate has metal provided on each of both surfaces the flexible substrate, and the metal on one of the surfaces is connected to the metal on the other, thereby reducing thermal resistance.

A method for producing a thermoelectric conversion module according to the present invention includes: mounting, at high intensity, p-type thermoelectric elements and n-type thermoelectric elements on mounting lands of a flexible substrate using an automatic mounting machine; and mounting, by one operation, the flexible substrate to another flexible substrate having a conductive paste printed on mounting lands thereof.

A thermoelectric power generation system of the present invention includes: a thermoelectric conversion module having a high-temperature side adjacent to an exhaust heat pipe; and a cooling heatsink or a water cooling pipe fixed, via a thermally conductive sheet, to a side of the thermoelectric conversion module opposite to the exhaust heat pipe.

Alternatively, a thermoelectric power generation system includes: a thermoelectric conversion module including micro thermoelectric elements mounted at high density on mounting lands of a substrate made of, for example, a thin resin film, the thermoelectric conversion module attached to an outer surface of an exhaust heat pipe; and a cooler cooling an outer side of the thermoelectric conversion module. The cooler includes a thermally-conductive flexible substrate which has a high thermal conductivity, and a plurality of heat dissipation fins which are provided on the thermally-conductive flexible substrate and extend parallel to a pipe axis of the exhaust heat pipe, and the highly thermally-conductive flexible substrate is curved along the outer surface of the exhaust heat pipe and is in contact with the exhaust heat pipe.

Alternatively, a thermoelectric power generation system includes: a thermoelectric conversion module including micro thermoelectric element chips mounted at high density on mounting lands of a substrate made of, for example, a thin resin film, the thermoelectric conversion module attached to an outer surface of a heat source such as an exhaust heat pipe; and a cooler cooling an outer side of the thermoelectric conversion module. The cooler includes a plurality of cooling pipes, and the cooling pipes are connected to each other not completely fixedly but loosely with a degree of freedom enabling the cooling pipes to fit on a curvature or bending of the outer surface of the thermoelectric conversion module.

Alternatively, in the thermoelectric power generation system, the cooling pipes are retained by a flexible sheet which is attached to a portion of a side surface of each cooling pipe and which connects the cooling pipes to each other, or by a wire with which the cooling pipes are tied together.

Alternatively, in the thermoelectric power generation system, the flexible sheet is a heat dissipation sheet, and the heat dissipation sheet is in contact with the outer side of the thermoelectric conversion module.

Alternatively, in the thermoelectric power generation system, the cooling pipes are arranged parallel to each other on a metal sheet, and the metal sheet is in contact with the thermoelectric conversion module.

Alternatively, in the thermoelectric power generation system, a flexible thin narrow tube or a flexible resin tube is provided to supply and discharge a cooling liquid to and from each of the cooling pipes, and the flexible thin narrow tube or the flexible resin tube is flexible to an extent to incompletely fix a positional relation among the cooling pipes.

A method for producing the thermoelectric power generation system includes: bonding the thermoelectric conversion module to the thermally-conductive flexible substrate or the cooling pipes in advance; and fixing the thermoelectric power generation system to the surface of the exhaust heat pipe to bring the thermoelectric power generation system into contact with the surface of the exhaust heat pipe.

Advantages of the Invention

In the thermoelectric conversion module of the present invention, one of the two flexible substrates has the slits. As a result, despite its device structure including the two flexible substrates, the thermoelectric conversion module is easy to bend and capable of following the curved surface of the exhaust heat pipe. In addition, the thermoelectric conversion module can be in substantially gapless contact with the exhaust heat pipe, via the thermally conductive sheet on the mounting surface of the thermoelectric conversion module. This can reduce variation in heat conduction to the thermoelectric elements.

Since the thermoelectric elements are connected to each other at both sides of the thermoelectric elements via the mounting lands of the flexible substrates, the shape and curing state of the conductive paste hardly cause variation in electric resistance. Since the surface is substantially flat, even if a water cooling pipe is attached to the outer side, uniform cooling can be achieved.

The metal formed on one surface of each flexible substrate is connected to the metal on the other surface of the flexible substrate. This configuration can increase thermal conductivity in the thickness direction of the flexible substrate made of polyimide, which would have the highest thermal resistance in a structure of the known art. As a result, the side adjacent to a heat source and the side adjacent to a cooler both become suitably thermally conductive, and a temperature differential is provided to the thermoelectric elements without loss.

The method including placing and mounting, by one operation, the thermoelectric elements mounted on one flexible substrate onto another flexible substrate having the conductive paste printed on its mounting lands enables efficient manufacture of the thermoelectric conversion modules.

The configuration in which the heatsink or the cooling pipes is/are in contact with the thermoelectric conversion module via the thermally conductive sheet reduces variation in the temperature differential provided to the thermoelectric elements, enabling improvement of thermoelectric conversion efficiency.

The thermoelectric power generation system of the present invention has a simple structure, is easy to produce, and facilitates fitting the group of cooling pipes on the outer surface of the thermoelectric conversion module substantially without leaving any gaps. The group of cooling pipes and the thermoelectric conversion module can be mounted on existing pipes. This eliminates the need for replacing the existing pipes with dedicated pipes which are complicated and expensive, for the installation of the thermoelectric power generation system. The present invention solves the problem involved in the known thermoelectric power generation system that includes the plurality of cooling copper pipes curved along the curved surface of a thermoelectric conversion module or a helical cooling copper pipes. Specifically, the present invention substantially prevents the formation of a gap which could be produced between the outer surface of the thermoelectric conversion module and the inside surface of the cooling pipe due to variation in the distance from the center of the exhaust heat pipe to the outer surface of the thermoelectric conversion module and variation in the radius of curvature of the curved surface of the cooling copper pipe. Thus, the present invention can significantly improve the cooling performance. As a result, the thermoelectric power generation system of the present invention has higher power generation efficiency, is manufacturable at a lower cost, easier to install, and more reliable than the known art.

In addition, the thermoelectric power generation system of the present invention can stably keep the thermal resistance between the thermoelectric conversion module and the cooling pipes or the heat exchanger including heat dissipation fins low, and can be installed on the exhaust heat pipe easily and stably.

DESCRIPTION OF EMBODIMENTS

Figure 1:
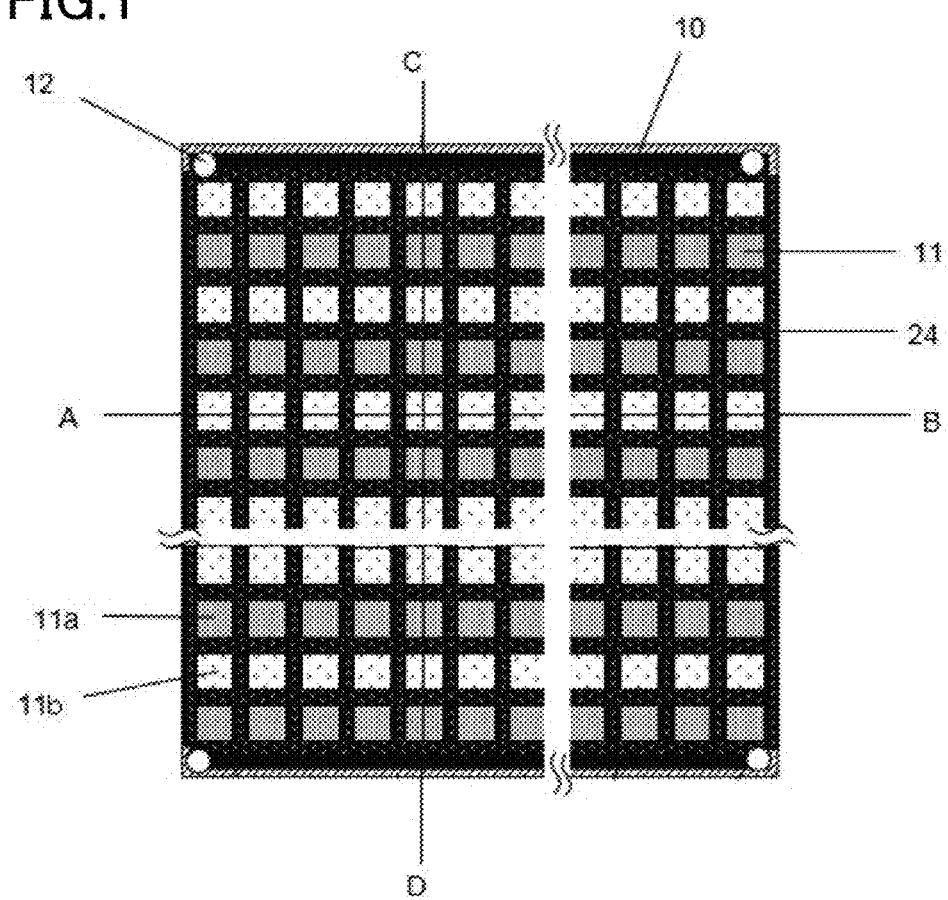
FIG. 1 is a plan view of a thermoelectric conversion module according to an embodiment of the present invention.
Figure 2:
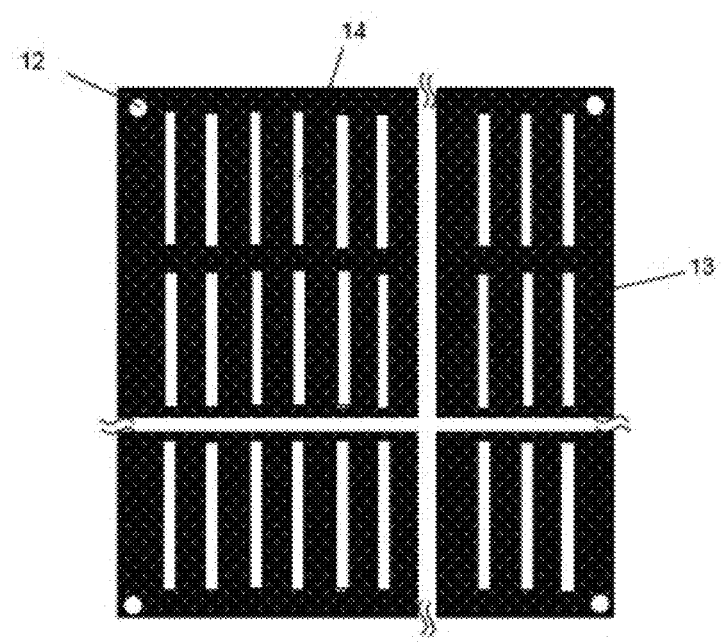
FIG. 2 is a plan view of an upper flexible substrate of the thermoelectric conversion module.

FIGS. 1 and 2 show an embodiment of the present invention. FIG. 1 is a plan view showing a lower flexible substrate 10 and thermoelectric elements 11 mounted on a surface of the lower flexible substrate 10 facing upward. The thermoelectric elements 11 include p-type thermoelectric elements 11a and n-type thermoelectric elements 11b, and are arranged such that the thermoelectric elements of the same type are adjacent to each other in an A-B direction and the thermoelectric elements of the opposite types alternate with each other in a C-D direction.

Reference numeral 12 denotes a jig hole. FIG. 2 shows an upper flexible substrate 13, which is joined to the thermoelectric elements 11 via land portions. The upper flexible substrate 13 has a plurality of slits 14 which extend in the C-D direction, so that bending of the upper flexible substrate 13 is facilitated between A and B. The slits 14 each have a width of about 0.2 mm, and are formed with a die punch during the production of the upper flexible substrate 13. Each of the lower and upper flexible substrates 10 and 13 has, in its four corner portions, the jig holes 12 for the purpose of precisely positioning the flexible substrates 10 and 13 to each other.

Figure 3:
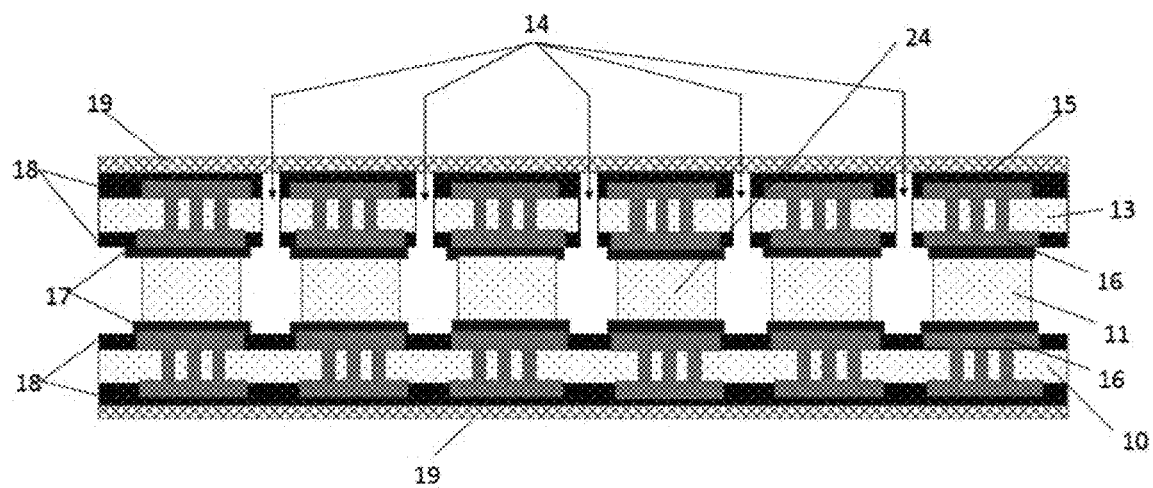
FIG. 3 is a cross-sectional view taken along line A-B in FIG. 1.

FIG. 3 is a cross-sectional view of the thermoelectric conversion module, taken along the line A-B in FIG. 1. The lower and upper flexible substrates 10 and 13 contain polyimide as a base material. Cu layers 15 and mounting lands 16 provided on surfaces of each of the lower and upper flexible substrates 10 and 13 are connected together via through holes. The thickness of polyimide (the lower and upper flexible substrates 10 and 13) ranges from 10 μm to 38 μm, and the thickness of the Cu layer 15 ranges from 8 μm to 35 μm. Each thermoelectric element 11 is joined to an associated one of the mounting lands 16 of the upper flexible substrate and an associated one of the mounting lands 16 of the lower flexible substrate with a conductive paste 17. The conductive paste 17 is selected from several types in accordance with the temperature of exhaust heat passing through a pipe for which the thermoelectric conversion module is used. Specifically, solder having a melting point of 150° C. or more, such as Sn—Ag—Bi based solder, is used as the conductive paste 17 of low temperature type (150° C.), and solder having a melting point of 250° C. or more, such as Au—Sn solder, is used as the conductive paste 17 of high temperature type (250° C.). Reference numeral 18 denotes a solder resist covering the mounting lands 16, and reference numeral 19 denotes a thermally conductive sheet 19 provided on an outer side.

Figure 4:
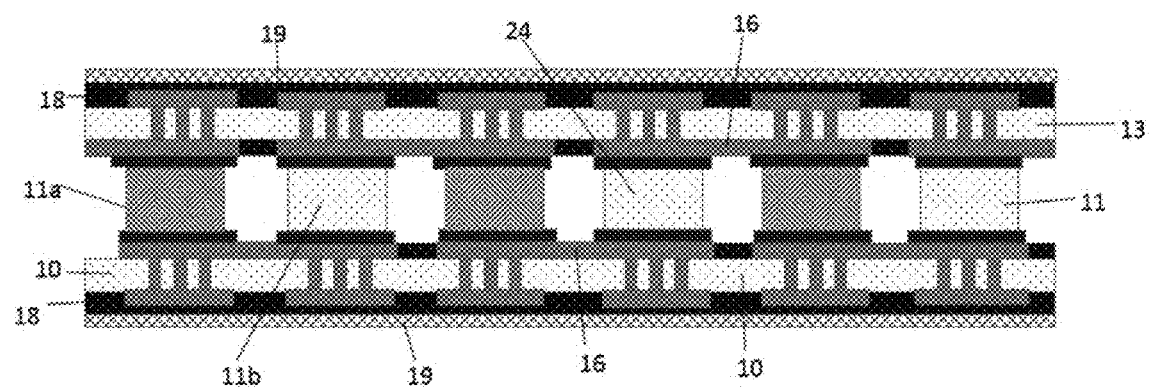
FIG. 4 is a cross-sectional view taken along line C-D in FIG. 1.

FIG. 4 is a cross-sectional view of the thermoelectric conversion module, taken along the line C-D in FIG. 1. One p-type thermoelectric element 11a and one n-type thermoelectric element 11b are mounted on each of the mounting lands 16 of the flexible substrates 10 and 13. Each mounting land 16 functions also as an interconnect connecting the p-type and n-type thermoelectric elements 11a and 11b mounted thereon together in series.

Figure 5:
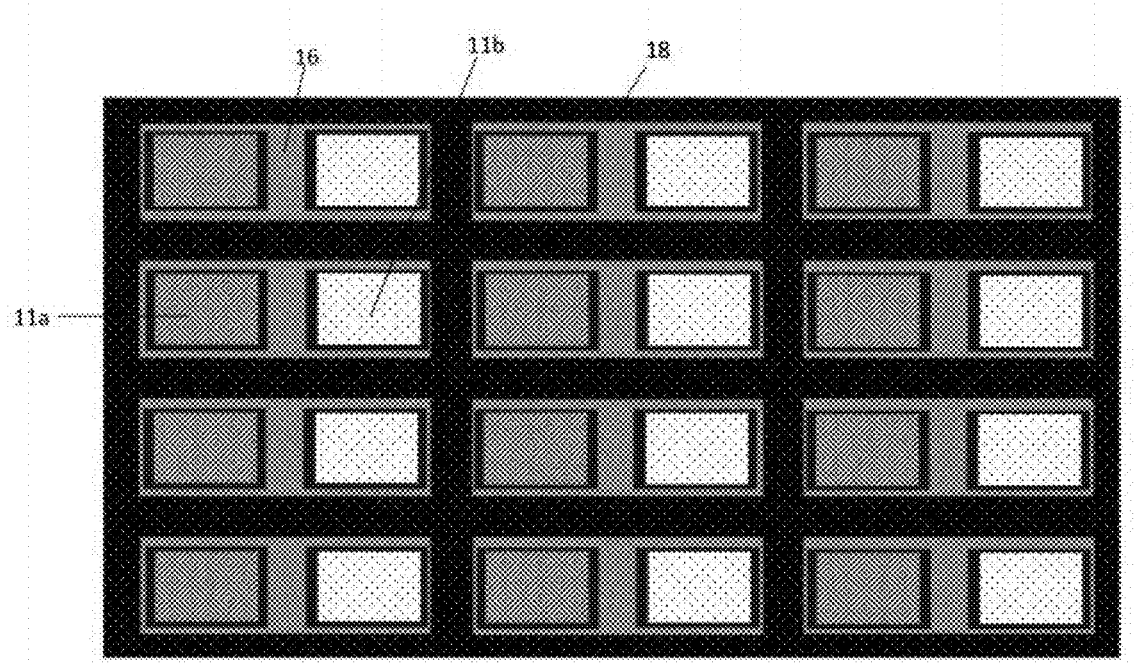
FIG. 5 is an enlarged plan view of a portion of a lower flexible substrate having p-type thermoelectric elements and n-type thermoelectric elements mounted on mounting lands of the lower flexible substrate.

FIG. 5 is an enlarged cross-sectional view of a portion of the lower flexible substrate 10 having the p-type thermoelectric elements 11a and the n-type thermoelectric elements 11b mounted on the mounting lands 16 of the lower flexible substrate 10. The solder resist 18 is printed between the mounting lands 16 to prevent a short circuit which may be caused by an overflow of the conductive paste 17. The solder resist 18 has a thickness ranging approximately from 15 μm to 40 μm.

Figure 6:
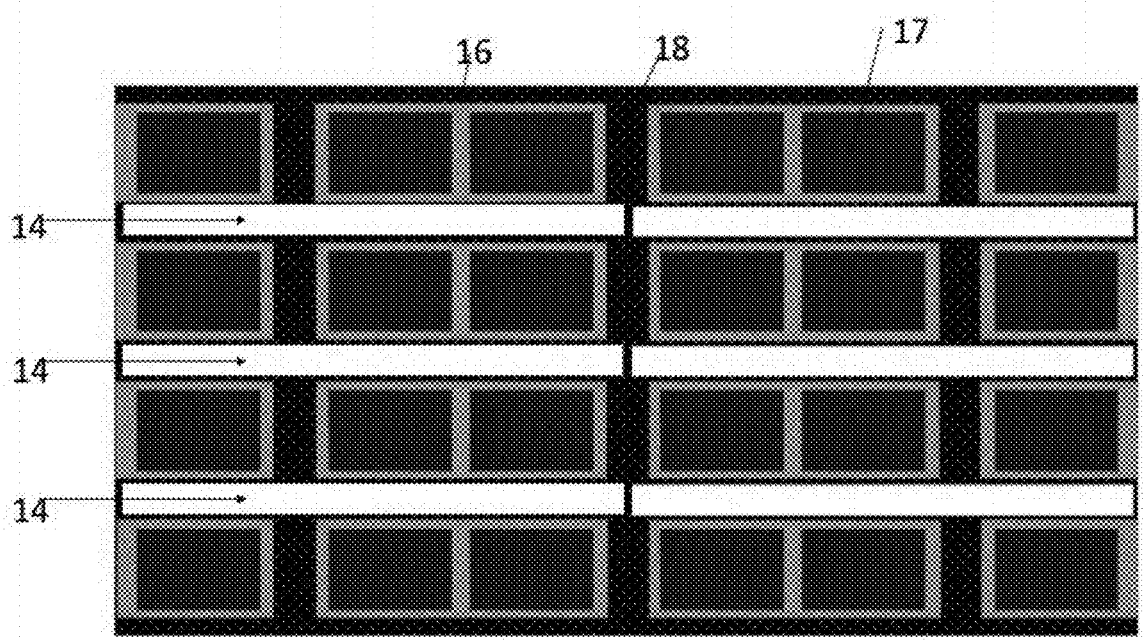
FIG. 6 is an enlarged plan view of a portion of an upper substrate having a conductive paste printed on its mounting lands.
Figure 7:
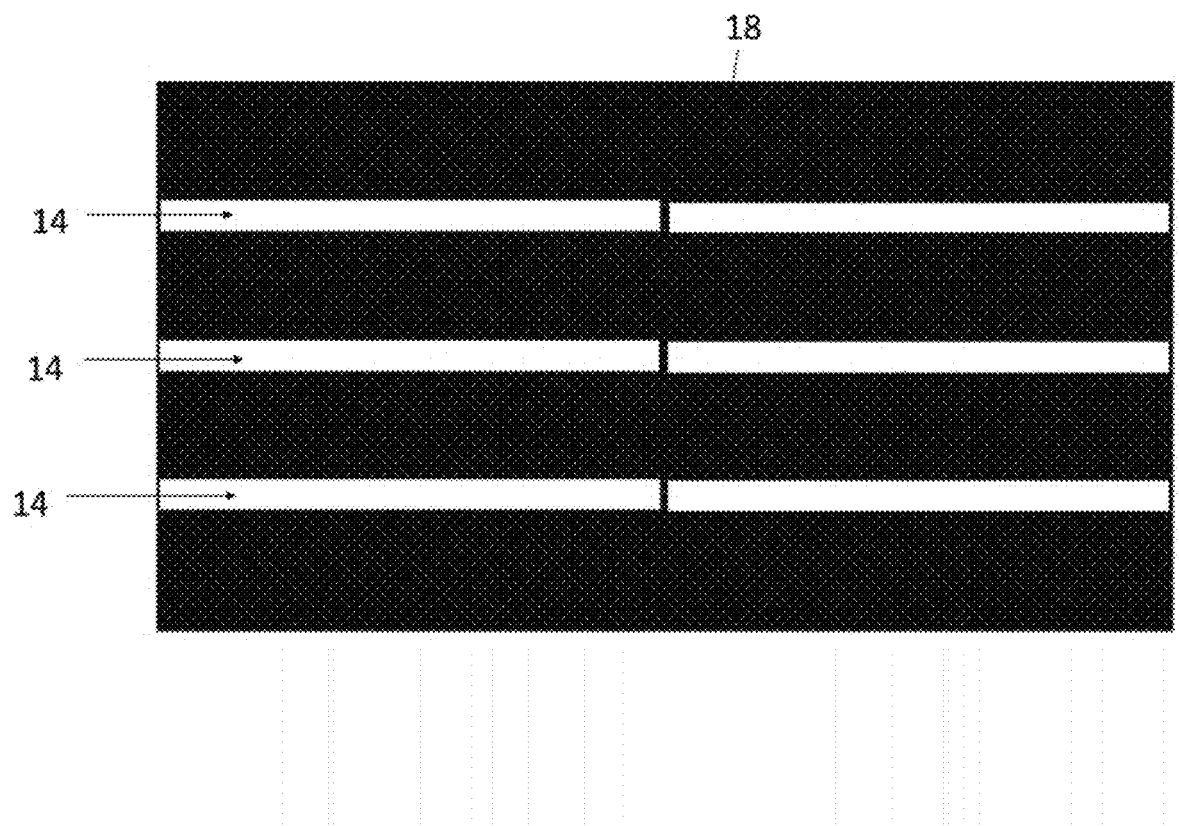
FIG. 7 shows a surface of the upper flexible substrate opposite to the surface shown in FIG. 6.
Figure 8:
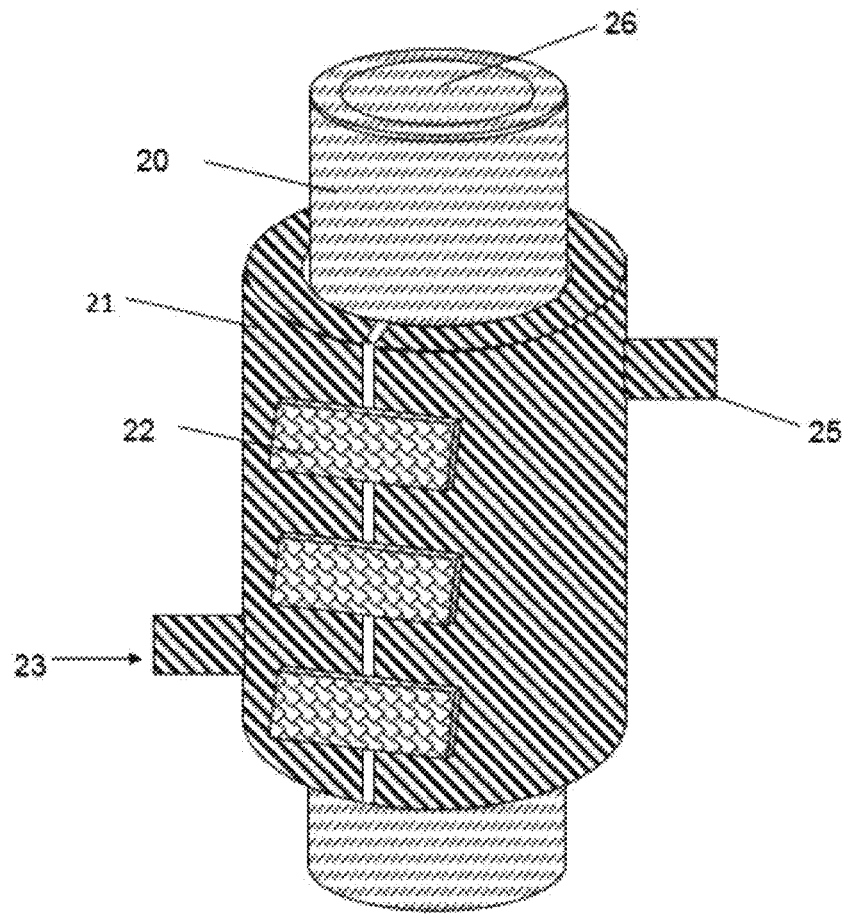
FIG. 8 shows an exhaust heat pipe and a cooling water pipe which is attached and fixed to the exhaust heat pipe with clasps.
Figure 9:
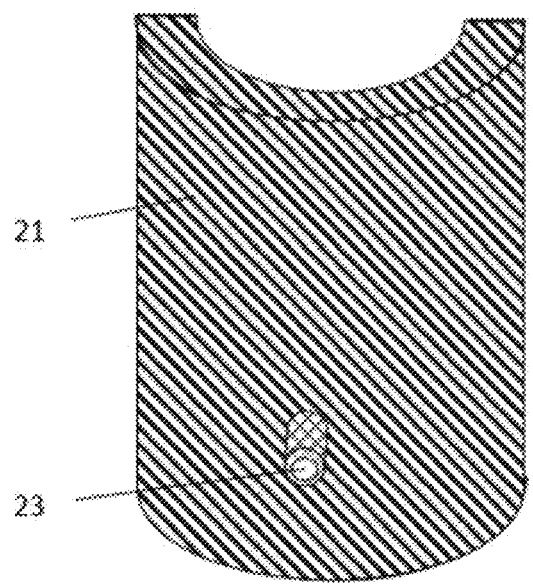
FIG. 9 is a perspective view of the cooling water pipes, as viewed from the front.
Figure 10:
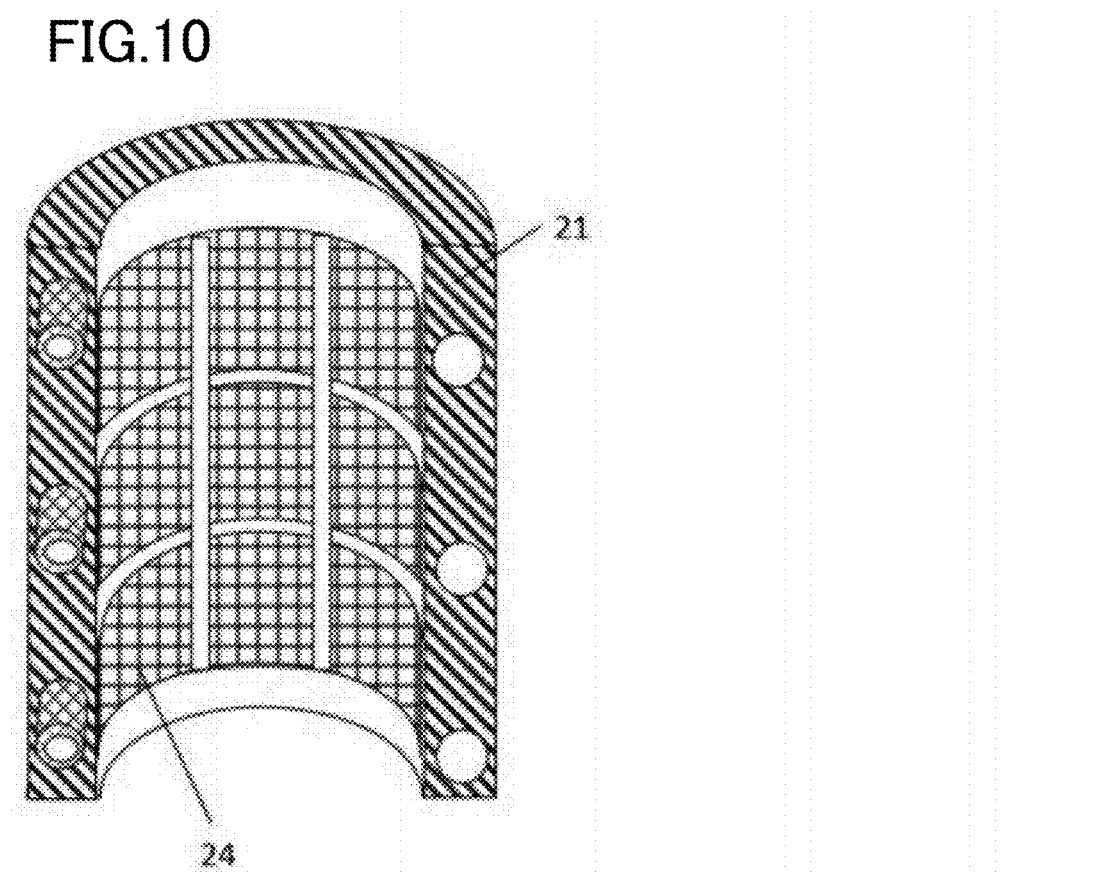
FIG. 10 is a perspective view of the cooling water pipe having a thermoelectric conversion module attached to its backside.
Figure 11:
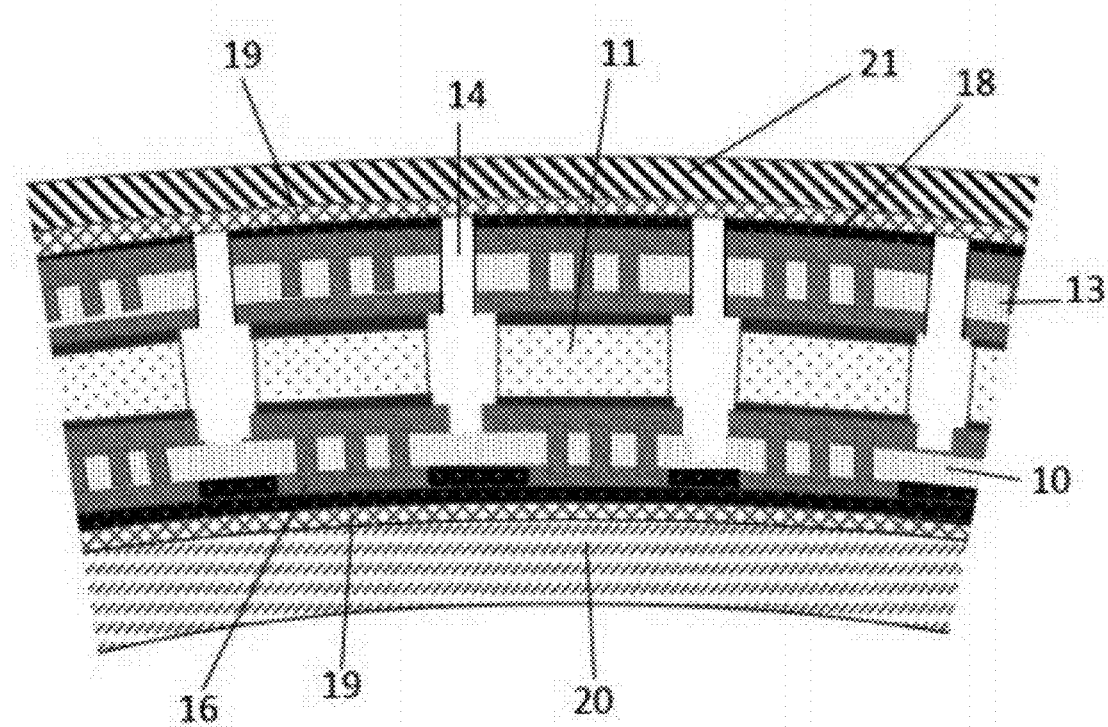
FIG. 11 is an enlarged cross-sectional view of a portion of the thermoelectric conversion module attached to an exhaust heat pipe.

FIG. 6 is an enlarged cross-sectional view of a portion of the upper flexible substrate 13 having the conductive paste 17 printed on the mounting lands 16 of the upper flexible substrate 13. The flexible substrate 13 has the slits 14 to facilitate bending of the flexible substrate 13. FIG. 7 shows a surface of the upper flexible substrate 13 opposite to the surface shown in FIG. 6. FIG. 8 shows an exhaust heat pipe 20 and a cooling water pipe 21 attached and fixed to the exhaust heat pipe 20 with clasps 22. Reference numeral 23 denotes a cooling water inlet, and reference numeral 25 denotes a cooling water outlet. Reference numeral 26 denotes a hot wastewater inlet. FIG. 9 shows the cooling water pipe 21, as viewed from the front. FIG. 10 shows the cooling water pipe 21 having a thermoelectric conversion module 24 attached to its backside. The cooling water pipe 21 is comprised of two parts. The two parts are joined together when the cooling water pipe 21 is mounted to the exhaust heat pipe 20. FIG. 11 is an enlarged cross-sectional view of a portion of the thermoelectric conversion module 24 attached to the exhaust heat pipe 20. The thermoelectric conversion module 24 has thermally conductive sheets 19 provided on both surfaces, and is bonded to the exhaust heat pipe 20 and the cooling water pipe 21 via the thermally conductive sheets 19 without leaving any gaps.

Making the thermally conductive sheets 19 adhesive facilitates the above bonding. For example, the thermal conductive sheet 19 can be produced by forming, into a sheet, a mixture of an adhesive substance such as acryl and a filler such as silica or a metal. The thermal conductive sheet 19 has a thickness ranging approximately from 10 μm to 100 μm. Note that in the embodiment described above, a stretchable material such as a silicone resin sheet may be employed as the base material for the upper flexible substrate 13, and the slits may be formed in the Cu layer 15. The stretchable material makes the upper flexible substrate 13 easy to bend.

Figure 12:
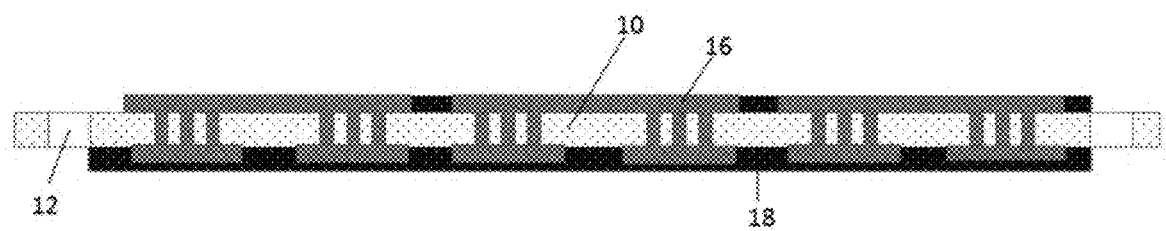
FIG. 12 is an enlarged cross-sectional view illustrating part of a process for producing the thermoelectric conversion module.
Figure 13:
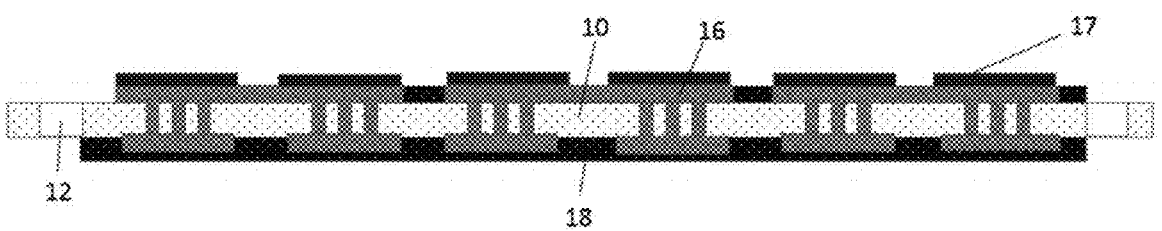
FIG. 13 is an enlarged cross-sectional view illustrating part of the process for producing the thermoelectric conversion module.
Figure 14:
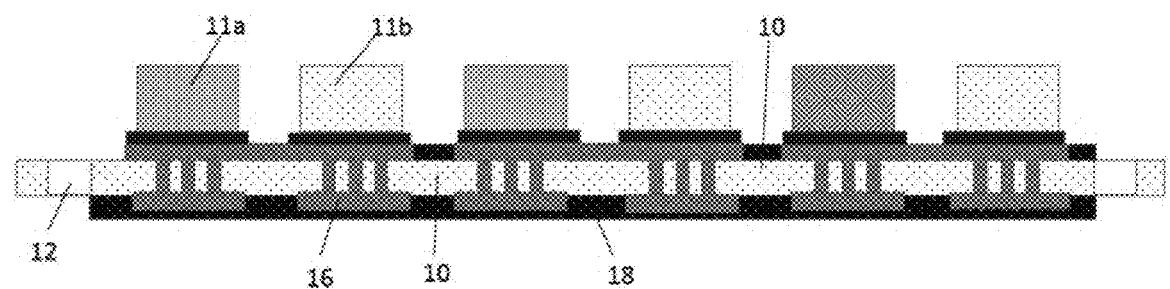
FIG. 14 is an enlarged cross-sectional view illustrating part of the process for producing the thermoelectric conversion module.
Figure 15:
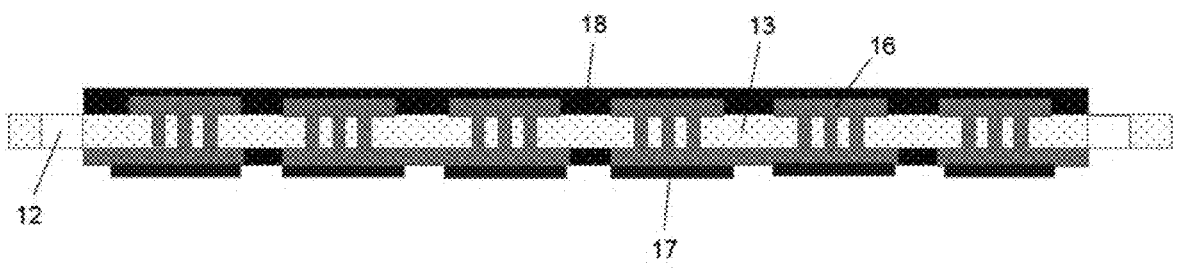
FIG. 15 is an enlarged cross-sectional view illustrating part of the process for producing the thermoelectric conversion module.
Figure 16:
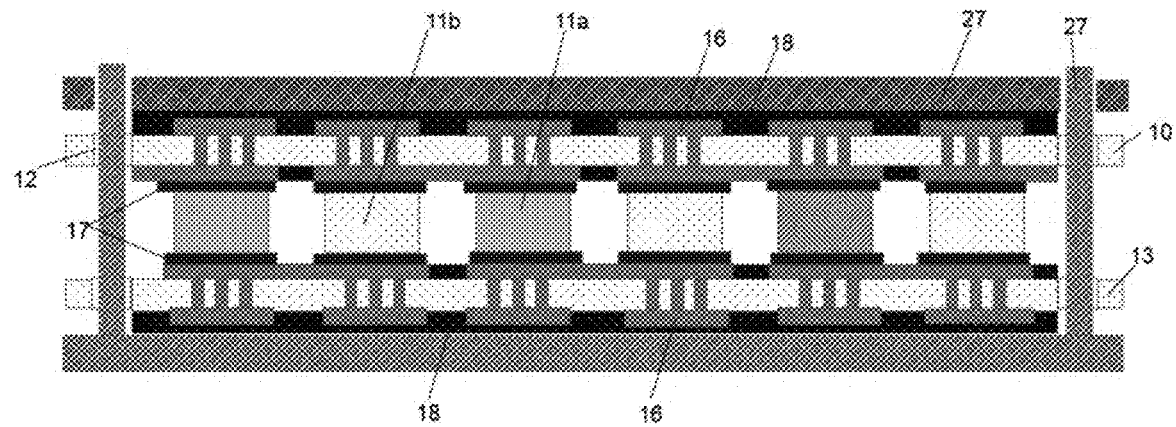
FIG. 16 is an enlarged cross-sectional view illustrating part of the process for producing the thermoelectric conversion module.
Figure 17:
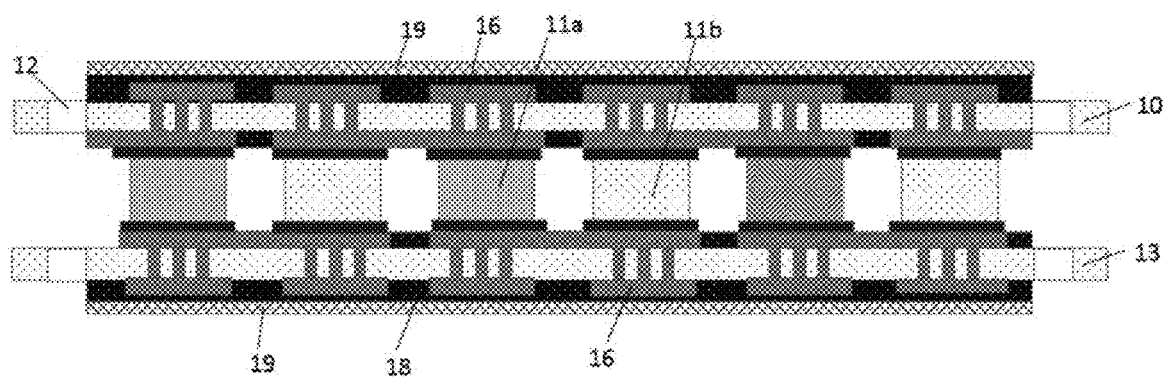
FIG. 17 is an enlarged cross-sectional view illustrating part of the process for producing the thermoelectric conversion module.
Figure 18:
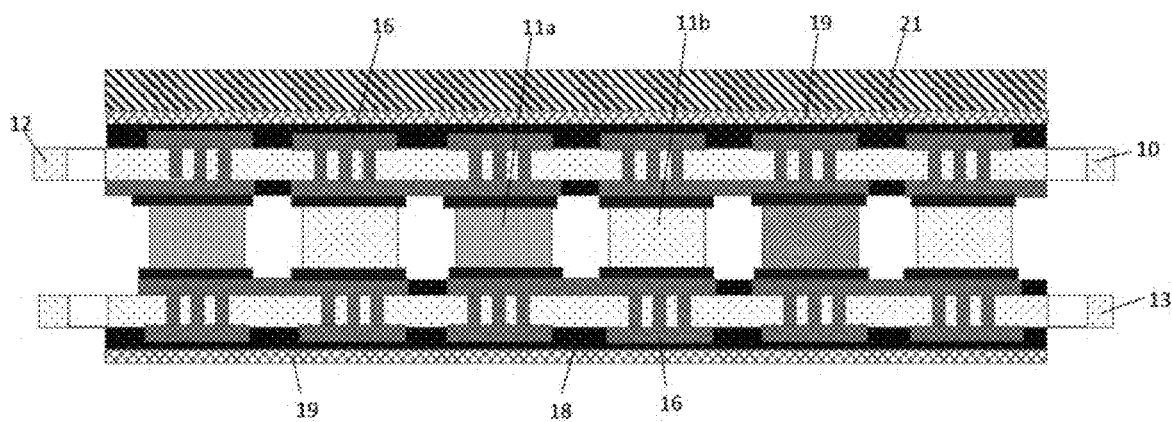
FIG. 18 is an enlarged cross-sectional view illustrating part of the process for producing the thermoelectric conversion module.

FIG. 12 is an enlarged cross-sectional view illustrating part of a process for producing the thermoelectric conversion module 24. The thermoelectric conversion module 24 can be produced in the process illustrated in FIGS. 12-18. As shown in FIG. 12, a solder resist 18 is provided on mounting lands 16 on a lower flexible substrate 10. As shown in FIG. 13, a conductive paste 17 is screen-printed on the mounting lands 16 of the lower flexible substrate 10. As shown in FIG. 14, p-type thermoelectric elements 11a and n-type thermoelectric elements 11b are mounted using a surface mounting machine. Heating is then carried out to cure the conductive paste 17. Next, as shown in FIG. 15, the conductive paste 17 is screen-printed on mounting lands 16 of an upper flexible substrate 13. Thereafter, as shown in FIG. 16, the lower flexible substrate 10 and the upper flexible substrate 13 are positioned to each other using jig holes 12 of the flexible substrates 10 and 13. A controlling metal jig 27 is used to bring the conductive paste 17 provided for the upper flexible substrate 13 into contact with the thermoelectric elements 11 of the lower flexible substrate 10. While the lower and upper flexible substrates 10 and 13 are fastened with the jig 27, heating is carried out to cure the conductive paste 17. Next, as shown in FIG. 17, thermally conductive sheets 19 are attached to the upper and lower flexible substrates 13 and 10, respectively. Finally, as shown in FIG. 18, the thermoelectric conversion module 24 is attached to the inside surface of a cooling water pipe 21 via the thermally conductive sheet 19.

Advantages of Embodiment

According to the embodiment described above, the lower flexible substrate 10 having a large number of the thermoelectric elements 11 mounted thereto is joined to the upper flexible substrate 13 via the mounting lands 16 of the flexible substrate 13. As a result, the mounting lands 16 function also as interconnects connecting the n-type thermoelectric elements 11b to the p-type thermoelectric elements 11a. This configuration can reduce the electric resistance and enhance the thermoelectric conversion efficiency.

In the known art, an interconnect of a conductive paste has been used to connect p-type thermoelectric elements 11a to n-type thermoelectric elements 11b. Formation of this interconnect involves the need for filling gaps between the thermoelectric elements with a resin. The present invention can eliminate this need. Such an interconnect of a conductive paste has an uneven surface, and makes the adhesion between the module of the known art and a cooling water pipe insufficient. This insufficient adhesion has been a factor of the decrease in thermal conductivity. This problem can be solved by the configuration of the above embodiment in which the mounting lands 16 of the upper flexible substrate 13 function also as the interconnects.

The slits 14 of the upper flexible substrate 13 make the thermoelectric conversion module 24 easy to bend and attach to even curved surfaces such as of the exhaust heat pipe 20 for hot wastewater or hot exhaust and the cooling water pipe 21. The thermally conductive sheets 19 and the Cu layers 15 on both surfaces of the flexible substrates can conduct a temperature differential between the exhaust heat pipe and cooling water to the thermoelectric elements with small loss. This contributes to the improvement of the thermoelectric conversion efficiency.

Attaching the thermally conductive sheets 19 to both surfaces of the thermoelectric conversion module 24 increases the adhesion between the thermoelectric conversion module 24 and the exhaust heat pipe 20 and the adhesion between the thermoelectric conversion module 24 and the cooling water pipe 21. In addition, attaching the thermoelectric conversion module 24 to the cooling water pipe 21 in advance allows the installation of the thermoelectric conversion module 24 to be implemented simply by fixing the cooling water pipe 21 to the exhaust heat pipe 20. This makes the installation work easy. If the thermally conductive sheets are adhesive, the installation work becomes easier.

Another Embodiment 1

Figure 19:
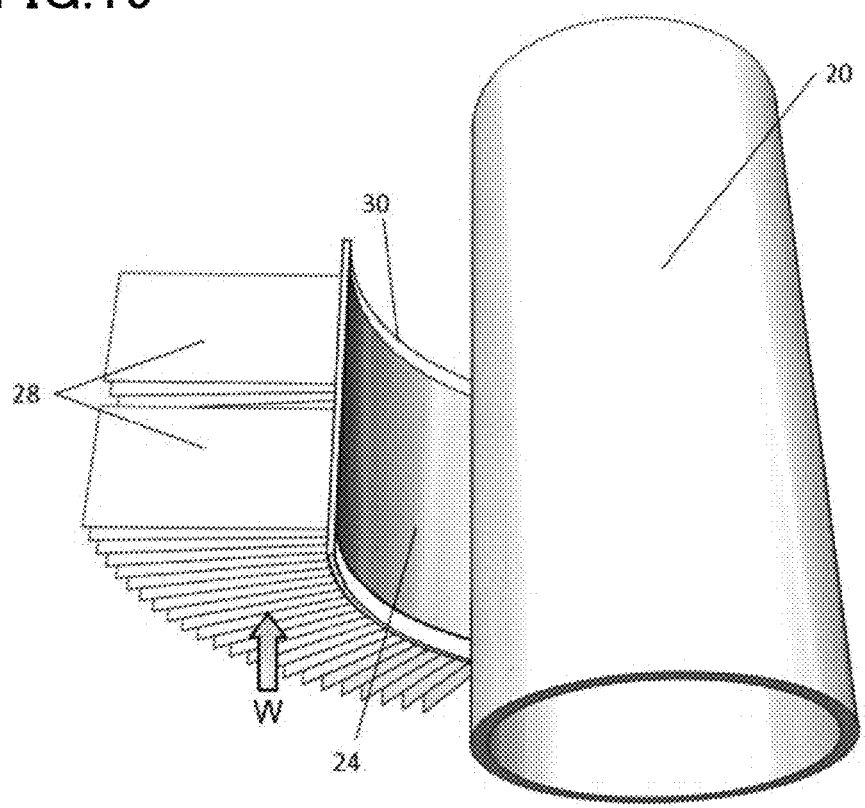
FIG. 19 is a perspective view of a thermoelectric power generation system configured to be installed on the exhaust heat pipe.

Another embodiment of the present invention will be described. In the drawings and description of this embodiment, the same components as those shown in the drawings of the embodiment described above are denoted by the corresponding reference numerals. FIG. 19 shows a thermoelectric power generation system configured to be installed on an exhaust heat pipe 20. The thermoelectric power generation system includes a heat exchanger and a thermoelectric conversion module 24 being in contact with the heat exchanger. The heat exchanger includes a thermally-conductive flexible substrate 30 and heat dissipation fins 28. In this embodiment, the thermally-conductive flexible substrate 30 is comprised of an aluminum sheet having a thickness ranging from 10 μm to 200 μm. Likewise, each heat dissipation fin 28 is comprised of an aluminum sheet having a thickness ranging from 10 μm to 500 μm. The thermally-conductive flexible substrate 30 and the heat dissipation fins 28 may be made of any other material having a high thermal conductivity, such as copper. The thermally-conductive flexible substrate 30 may be suitably thin to be flexible to the extent that the thermally-conductive flexible substrate 30 can be curved easily and be in contact with the with the exhaust heat pipe 20 via the thermoelectric conversion module 24 being in contact with the thermally-conductive flexible substrate 30.

Figure 20:
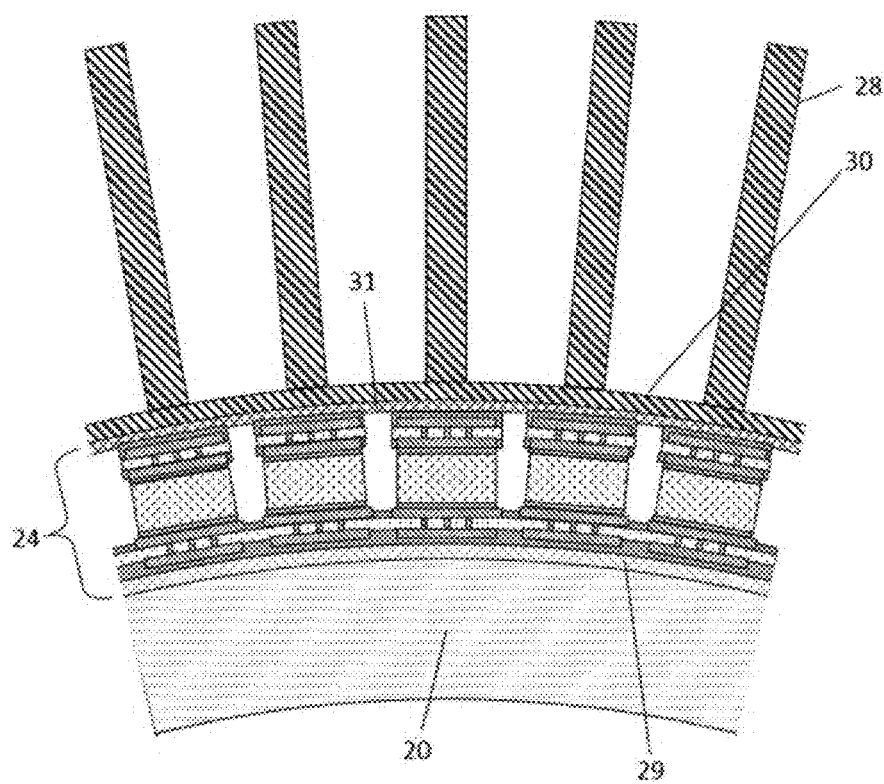
FIG. 20 is a cross-sectional view of a thermoelectric power generation system including a heat exchanger and a thermoelectric conversion module and installed on an exhaust heat pipe, taken along a plane orthogonal to the pipe axial direction of the exhaust heat pipe.

FIG. 20 is a cross-sectional view of the thermoelectric power generation system including the heat exchanger and the thermoelectric conversion module 24 and installed on the exhaust heat pipe 20, taken along a plane orthogonal to the axial direction of the exhaust heat pipe 20. The thermoelectric conversion module 24 is in contact with the thermally-conductive flexible substrate 30 via a thermally conductive sheet 31 which forms the outermost layer of the thermoelectric conversion module 24. In the configuration exemplified in this embodiment, the thermally conductive sheet 31 is interposed. Alternatively, instead of this configuration, the thermoelectric conversion module 24 and the thermally-conductive flexible substrate 30 may be directly bonded to each other via a thin adhesive layer. On the other hand, the thermoelectric power generation system is bonded to the exhaust heat pipe 20, which is the heat source, via a thermally conductive sheet 29, thereby implementing the installation of the thermoelectric power generation system. The thermally conductive sheet 29 is made of a material which resists the surface temperature of the exhaust heat pipe 20 and has a high thermal conductivity. Examples of the material for the thermally conductive sheet 29 include polyurethane-based resin, silicone resin, silicone rubber, a graphite sheet, and a paste of boron nitride. In accordance with the surface roughness of the exhaust heat pipe 20, a sheet having predetermined cushioning is used as the thermally conductive sheet 29.

As shown in the drawings, the heat dissipation fins 28 are arranged, on the thermally-conductive flexible substrate 30, at regular intervals and in a direction parallel to the pipe axis of the exhaust heat pipe 20.

As shown in FIG. 19, the heat dissipation fins 28 are cooled by receiving air blown by a blower fan at a predetermined airflow rate in the direction indicated by the arrow W shown in a lower portion of FIG. 19. In this embodiment, the forced air cooling with the blower fan has been exemplified. However, the present invention is applicable to a natural air cooling system using no blower fan.

For the sake of simplification, FIG. 19 shows only a portion extracted from one module. Alternatively, in accordance with the purpose, two or more thermoelectric conversion modules 24 may be arranged on the thermally-conductive flexible substrate 30 such that the thermoelectric conversion modules 24 surround the outer periphery of the exhaust heat pipe 20.

Figure 21:
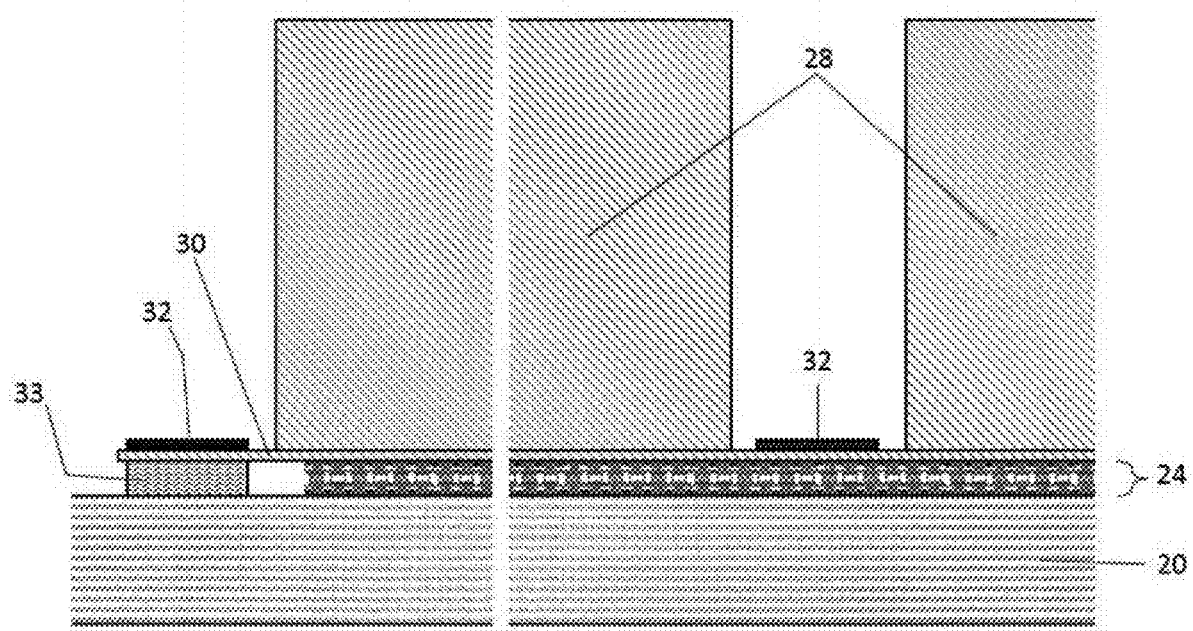
FIG. 21 is a cross-sectional view of the thermoelectric power generation system including the heat exchanger and the thermoelectric conversion module and installed on the exhaust heat pipe, taken along a plane parallel to the pipe axial direction of the exhaust heat pipe.

FIG. 21 is a cross-sectional view of the thermoelectric power generation system including the heat exchanger and the thermoelectric conversion module 24 and installed on the exhaust heat pipe 20, taken along a plane parallel to the pipe axial direction of the exhaust heat pipe 20. The thermoelectric power generation system is tied down with a fixing band 32 so as to be fixed to the exhaust heat pipe 20. The fixing band 32 is wound on a portion of the surface of the thermally-conductive flexible substrate 30 corresponding to a heat exchanger end portion or a central portion. As shown in FIG. 21, a highly thermally insulating spacer 33 is interposed as a bolster at, for example, an end portion where the thermoelectric conversion module 24 is absent under thermally-conductive flexible substrate 30, and the fixing band is fastened over the high thermal insulation spacer 33. For example, the highly thermally insulating spacer 33 is made of a thermally insulating sheet including glass wool fibers or ceramic fibers.

In this embodiment, the heat dissipation fins 28 are arranged, on the thermally-conductive flexible substrate 30, in a direction parallel to the pipe axis of the exhaust heat pipe 20 (i.e., in the lateral direction on the paper). This configuration provides, in the pipe axial direction, a flexural strength great enough to bring the thermoelectric power generation system into contact with the exhaust heat pipe 20. At the same time, this configuration makes the thermally-conductive flexible substrate 30 having thereon the heat dissipation fins 28 easy to bend in a curve direction which is orthogonal to the pipe axial direction. Further, the thermoelectric conversion module of the present invention has flexibility as its characteristic. As a result, the thermoelectric power generation system is capable of being freely curved along the curved surface of the exhaust heat pipe 20, and thus, is easy to fit on, and bring into contact with, the exhaust heat pipe 20. This advantage is attributed to the following feature of present invention. The thermoelectric generation system of the present invention is structured to be inflexible in the direction parallel to the surfaces of the heat dissipation fins 28 and to be flexibly angled in the curve direction orthogonal to the surfaces of the heat dissipation fins 28. Consequently, even if the thermoelectric power generation system is mounted on the exhaust heat pipe 20 with the heat dissipation fins 28 slightly angled with respect to the pipe axis of the exhaust heat pipe 20, the thermoelectric power generation system by itself fits on, and comes into contact with, the curved surface of the exhaust heat pipe 20, just like "a reed screen" or "a bamboo blind" in the Japanese language.

This embodiment can significantly ease the problem of the known cooling structure: a gap between a heat exchanger and a thermoelectric conversion module prevents the achievement of desired cooling effect. Thus, this embodiment can considerably improve the power generation efficiency.

Another Embodiment 2

Figure 22:
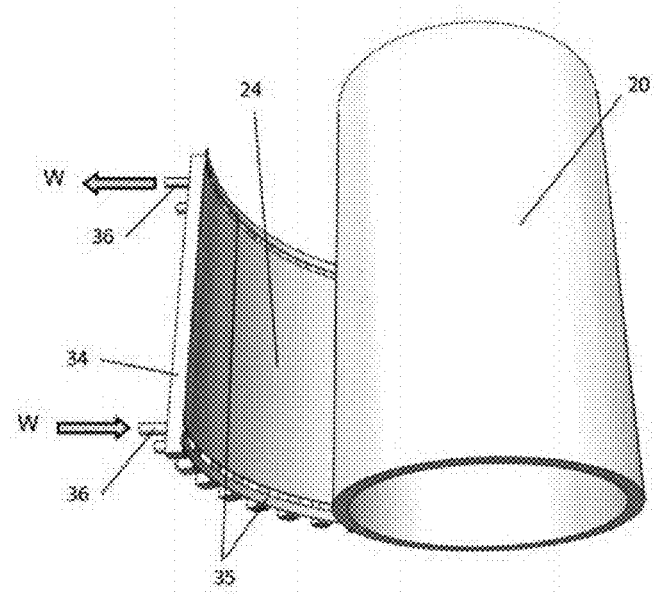
FIG. 22 is a perspective view of a thermoelectric power generation system according to another embodiment, including a heat exchanger and a thermoelectric conversion module which is in contact with the heat exchanger.

FIG. 22 shows another embodiment of the present invention. In the drawings and description of this embodiment, the same components as those shown in the drawings of the embodiments described above are denoted by the corresponding reference numerals. The shown thermoelectric power generation system includes a heat exchanger and a thermoelectric conversion module 24 which is in contact with the heat exchanger. The heat exchanger includes a plurality of cooling pipes 34 which are connected to one another with flexible sheets 35. The thermoelectric conversion module 24 is in contact with the cooling pipes 34. In this embodiment, each cooling pipe 34 is comprised of a copper rectangular pipe of which each side in cross section has an outside dimension ranging from 3 mm to 20 mm, and both ends are closed. Both ends of each cooling pipe 34 are provided with couplings 36 through which cooling water flows into and out of the cooling pipe 34 as indicated by arrows W. Thus, the cooling water cools the surface of the thermoelectric conversion module 24 that is in contact with the cooling pipes 34. For example, the flexible sheets 35 are each made of a heat-resistant silicone rubber, or a multilayer sheet including silicone rubber and highly thermally insulating glass wool or ceramic fibers. The cooling pipes 34 may be made of any other material having a high thermal conductivity, instead of copper.

Figure 23:
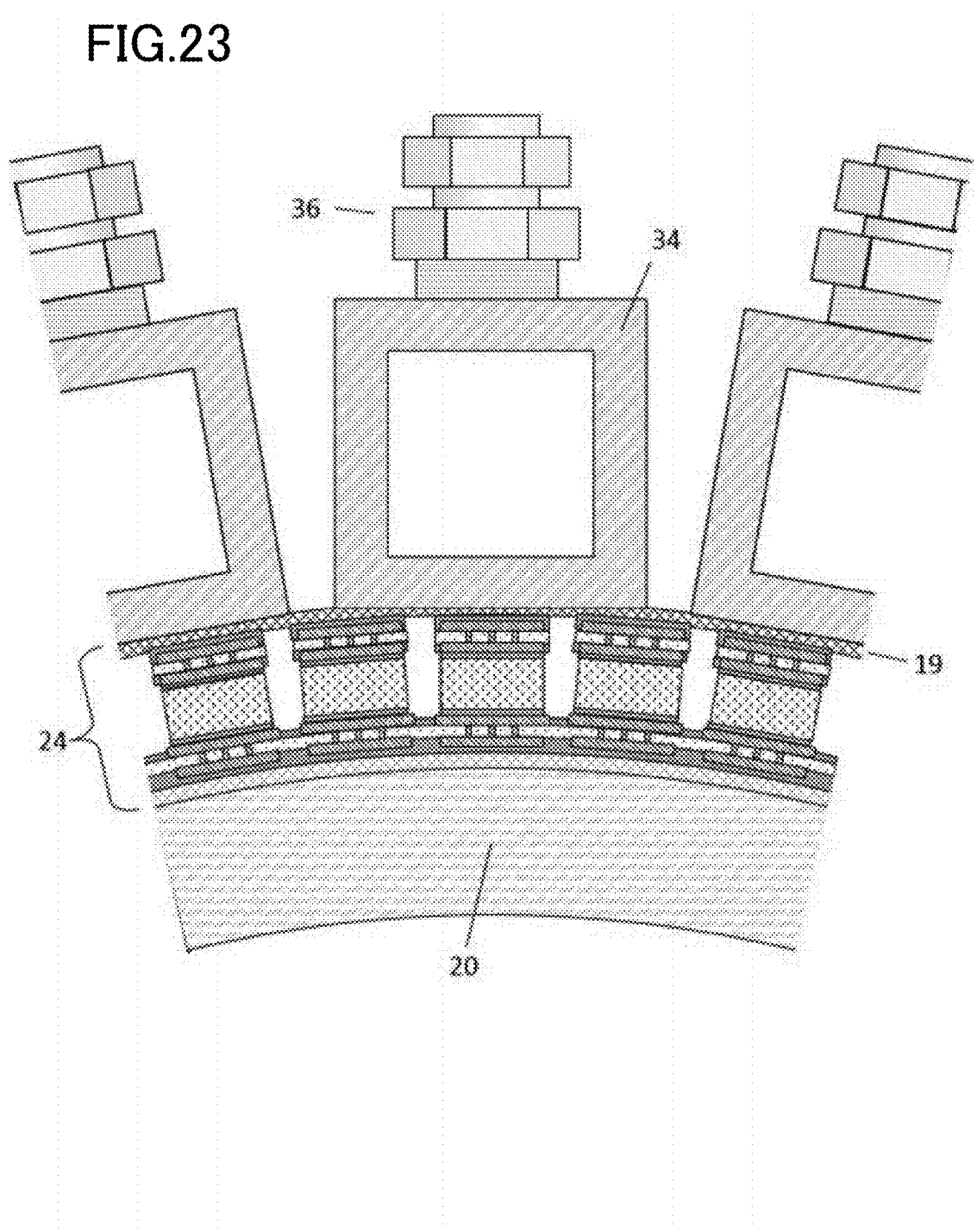
FIG. 23 is a cross-sectional view of the thermoelectric power generation system including the heat exchanger and the thermoelectric conversion module and installed on an exhaust heat pipe, taken along a plane orthogonal to the pipe axial direction of the exhaust heat pipe.

FIG. 23 is a cross-sectional view of the thermoelectric power generation system including the heat exchanger and the thermoelectric conversion module 24 and installed on the exhaust heat pipe 20, taken along a plane orthogonal to the pipe axial direction of the exhaust heat pipe 20. The thermoelectric conversion module 24 is in contact with the bottom surfaces of the cooling pipes 34 via a thermally conductive sheet 19 which forms the outermost layer of the thermoelectric conversion module 24. Although the cooling pipes 34 of this embodiment are configured as rectangular pipes having a flat bottom surface, the cooling pipes 34 may be pipes having a curvature, such as cylindrical pipes. The thermally conductive sheet 19 has a thickness ranging from 50 μm to 500 μm, and is made of a polyurethane-based resin, a silicone resin, or a silicone rubber, which is flexible and cushioning.

The cooling pipes 34 are connected together with the flexible sheets 35 such that the cooling pipes 34 extend parallel to the pipe axis of the exhaust heat pipe 20 and are arranged at predetermined intervals. The cooling pipes 34 may be connected together with wire, instead of the flexible sheets 35. In this embodiment, the connection among the cooling pipes is implemented with the flexible sheets 35. Alternatively, the cooling pipes 34 may be connected together by being directly bonded to the thermoelectric conversion module 24 via a thermally-conductive adhesive sheet 29. In that case, the flexible sheets 35 may be omitted.

For the sake of simplification, FIG. 22 shows only a portion extracted from one module. Alternatively, in accordance with the purpose, two or more thermoelectric conversion modules 24 may be arranged such that the thermoelectric conversion modules 24 surround the outer periphery of the exhaust heat pipe 20.

Figure 24:
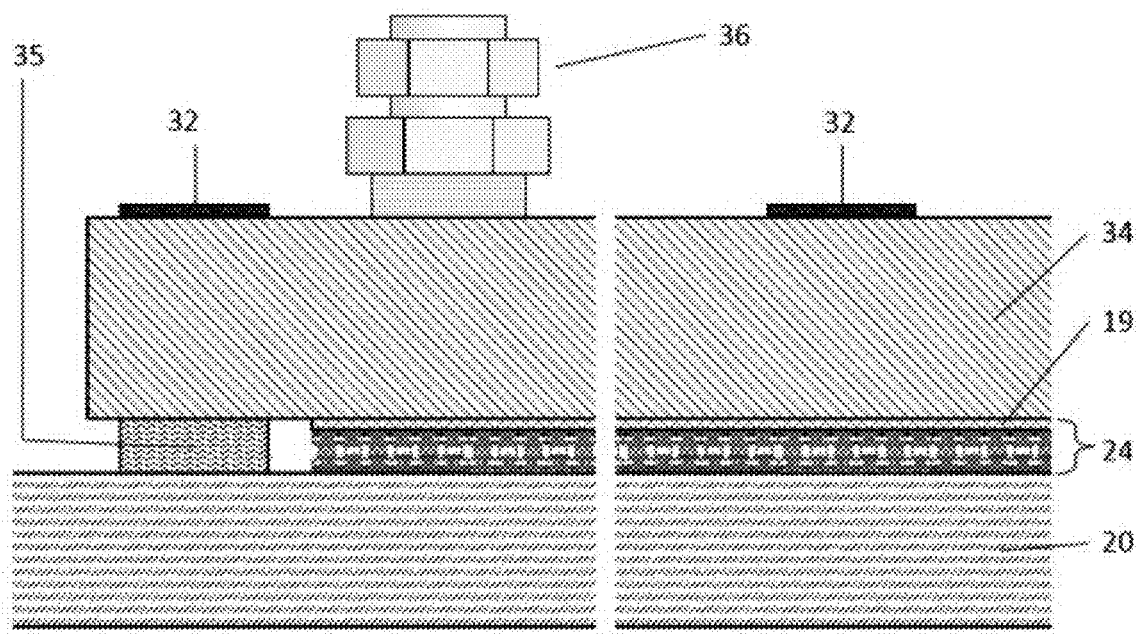
FIG. 24 is an enlarged cross-sectional view of the thermoelectric power generation system installed on the exhaust heat pipe, taken along a plane parallel to the pipe axial direction of the exhaust heat pipe.

FIG. 24 is an enlarged cross-sectional view of the thermoelectric power generation system installed on the exhaust heat pipe 20, taken along a plane parallel to the pipe axial direction of the exhaust heat pipe 20. The thermoelectric power generation system is tied down with a fixing band 32 so as to be fixed to the exhaust heat pipe 20. The fixing band 32 is wound on a portion of each cooling pipe 34 corresponding to a heat exchanger end portion or a central portion. As shown in the FIG. 24, the flexible sheet 35 that is highly thermally insulating is interposed as a bolster in an end portion where the thermoelectric conversion module 24 is absent under the cooling pipe 34, and the fixing band is fastened over the flexible sheet 35. If no flexible sheet 35 is used to connect the cooling pipes 34 together, a spacer which is highly thermally insulating like the flexible sheet 35 is interposed instead of the flexible sheet 35, and the fixing band 32 is fastened over the highly thermally insulating spacer, thereby bringing the thermoelectric power generation system into contact with the exhaust heat pipe 20.

The thermoelectric power generation system is tied down with a fixing band 32 so as to be fixed to the exhaust heat pipe 20. The fixing band 32 is wound on a portion of each cooling pipe 34 corresponding to a heat exchanger end portion or a central portion. As shown in the FIG. 24, the flexible sheet 35 that is highly thermally insulating is interposed as a bolster in an end portion where the thermoelectric conversion module 24 is absent under the cooling pipe 34, and the fixing band is fastened over the flexible sheet 35. If no flexible sheet 35 is used to connect the cooling pipes 34 together, a spacer which is highly thermally insulating like the flexible sheet 35 is interposed instead of the flexible sheet 35, and the fixing band 32 is fastened over the highly thermally insulating spacer, thereby bringing the thermoelectric power generation system into contact with the exhaust heat pipe 20.

Figure 25:
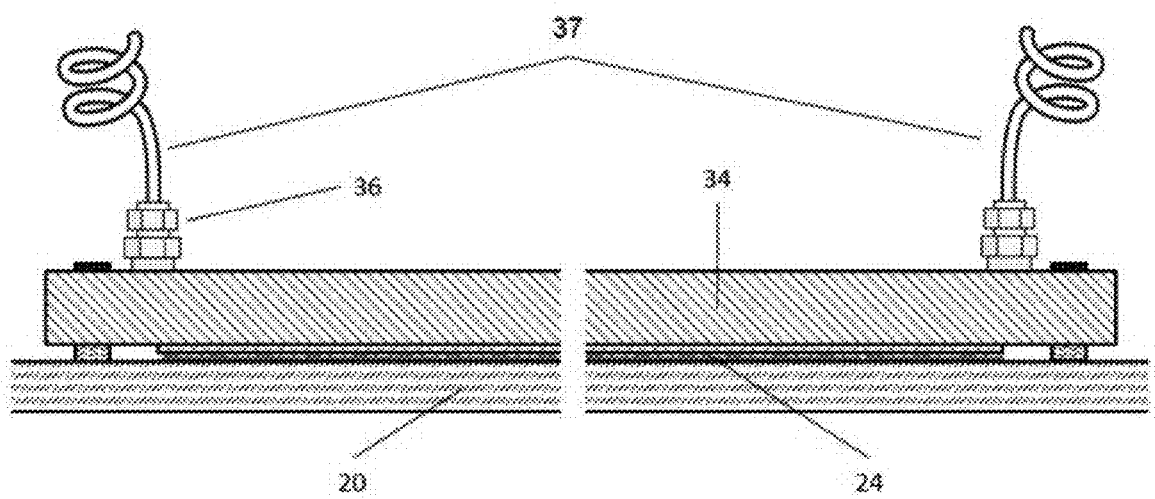
FIG. 25 is a cross-sectional view of the thermoelectric power generation system installed on the exhaust heat pipe, taken along a plane parallel to the pipe axial direction of the exhaust heat pipe.

FIG. 25 is a cross-sectional view of the thermoelectric power generation system installed on the exhaust heat pipe 20, taken along a plane parallel to the pipe axial direction of the exhaust heat pipe 20. Cooling water tubes 37 for the supply and discharge of cooling water for cooling the cooling pipes 34 are each comprised of a flexible narrow metal tube made of copper or aluminum or a flexible resin tube such that the cooling water tubes 37 do not fix the positional relation among the cooling pipes. The cooling water tubes 37 extend from a main pipe and connect the cooling pipes together in parallel or sequentially in series.

In this embodiment, the cooling pipes 34 are arranged to extend in a direction parallel to the pipe axis of the exhaust heat pipe 20, via the flexible sheets 35 or the thermally conductive sheet 19 that forms the outermost layer of the thermoelectric conversion module 24. This configuration provides, in the pipe axial direction, a flexural strength great enough to bring the thermoelectric power generation system in contact with the exhaust heat pipe 20. At the same time, this configuration has, in a curve direction which is orthogonal to the pipe axial direction, a degree of freedom enabling the cooling pipes 34 to be freely oriented. Further, the thermoelectric conversion module 24 of the present invention has flexibility as its characteristic. As a result, the thermoelectric power generation system 24 is capable of being freely curved along the curved surface of the exhaust heat pipe 20, and thus, is easy to fit on, and bring into contact with, the exhaust heat pipe 20. This advantage is attributed to the following feature of present invention: The thermoelectric power generation system of the present invention is structured to be inflexible in the longitudinal direction of the cooling pipes 34 and to be flexibly angled in the direction orthogonal to the longitudinal direction of the cooling pipes 34. Consequently, even if the thermoelectric power generation system is mounted to the pipe 20 with the cooling pipes 34 slightly angled with respect to the pipe axis of the exhaust heat pipe 20, the thermoelectric power generation system by itself fits on, and comes into contact with, the curved surface of the exhaust heat pipe 20, just like "a reed screen or "a bamboo blind" in the Japanese language.

This embodiment can significantly ease the problem of the known cooling structure: a gap between a heat exchanger and a thermoelectric conversion module prevents the achievement of desired cooling effect. Thus, this embodiment can considerably improve the power generation efficiency.

Another Embodiment 3

Figure 26:
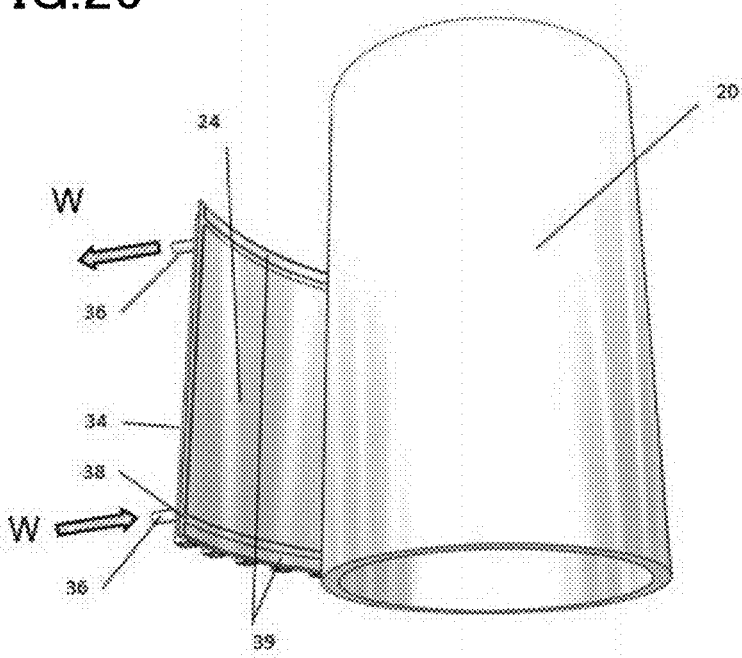
FIG. 26 is a perspective view of an embodiment including a heat exchanger comprised of a metal sheet and cooling pipes arranged parallel to each other on the metal sheet.
Figure 27:
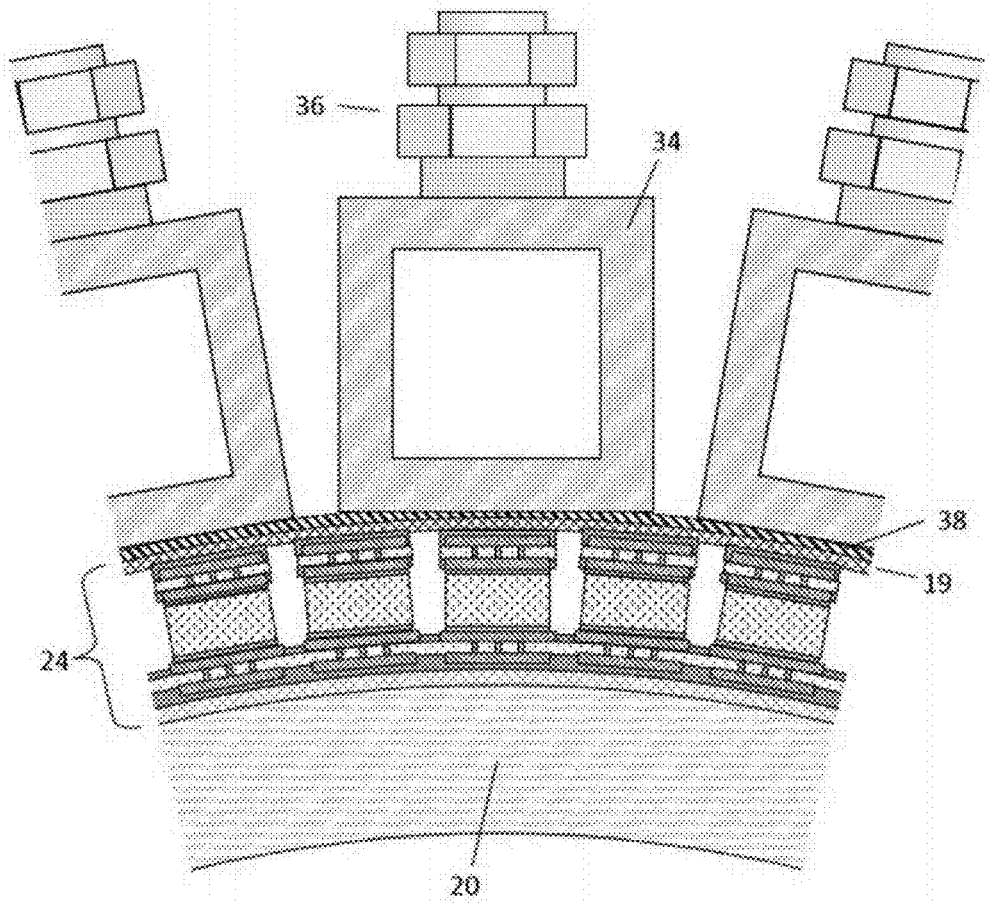
FIG. 27 is a cross-sectional view of the embodiment including the heat exchanger comprised of the metal sheet and the cooling pipes arranged parallel to each other on the metal sheet.

FIGS. 26 and 27 show another embodiment of the present invention. The third embodiment is the same as the second embodiment, except that the heat exchanger includes a metal sheet 38 and cooling pipes 34 arranged parallel to one another on the metal sheet 38. Here, the metal sheet 38 is made of copper like the cooling pipes 34, and has a thickness ranging from 10 μm to 300 μm. The cooling pipes 34 are fixed to the metal sheet 38 with a highly thermally conductive adhesive. Optionally, silver solder may be used to fix the cooling pipes 34 to the metal sheet 38. The rest of the configuration of the third embodiment and the advantages of the third embodiment are the same as those of the second embodiment. Reference numeral 39 denotes a highly thermally insulating spacer.

Embodiment of Method for Producing Thermoelectric Power Generation System

Figure 28:
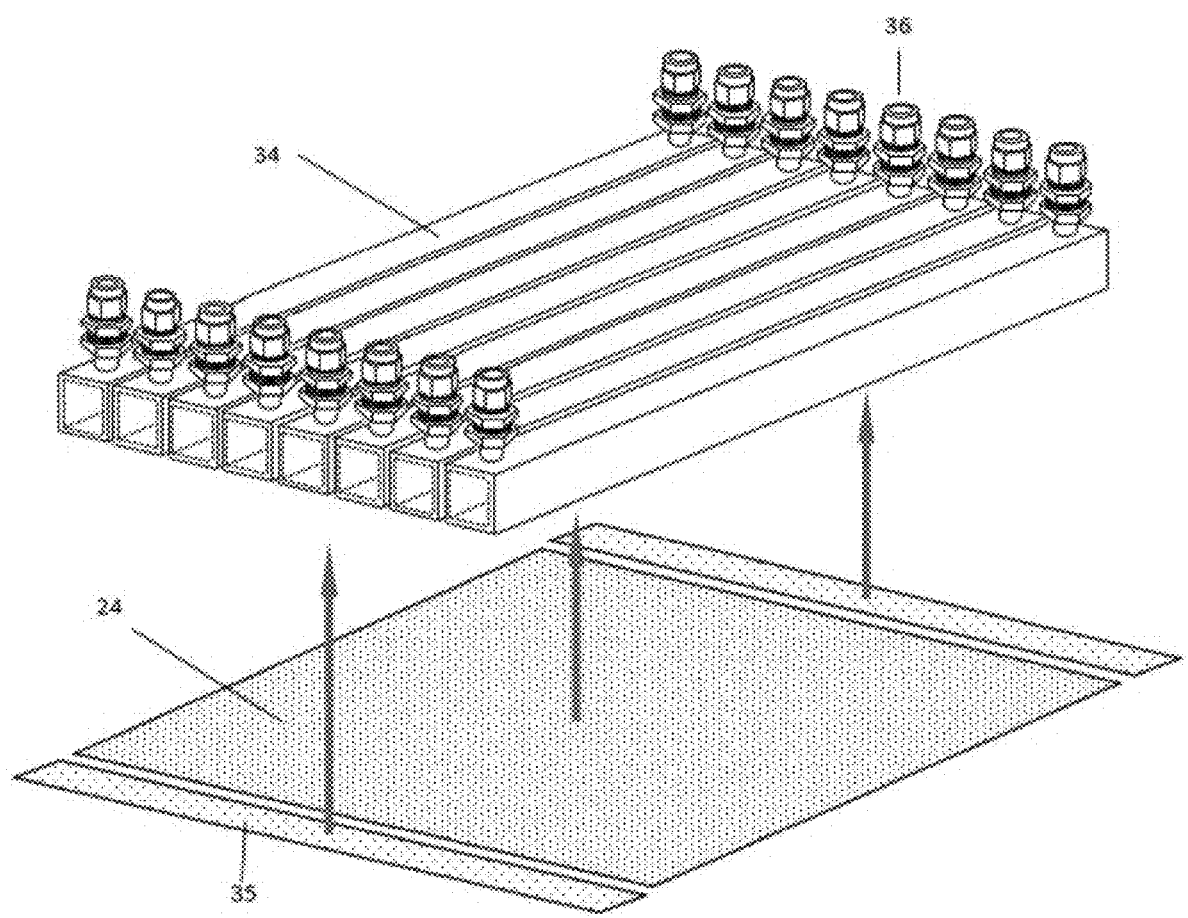
FIG. 28 is a perspective view illustrating a method for producing the thermoelectric power generation system.
Figure 29:
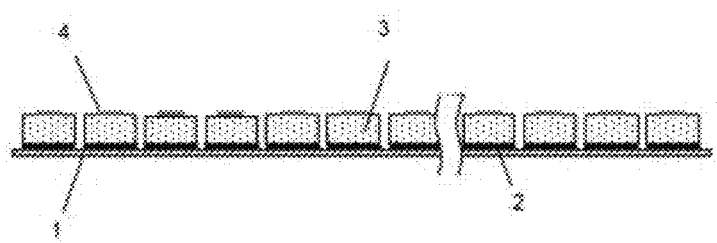
FIG. 29 shows a thermoelectric conversion module of the known art.
Figure 30:
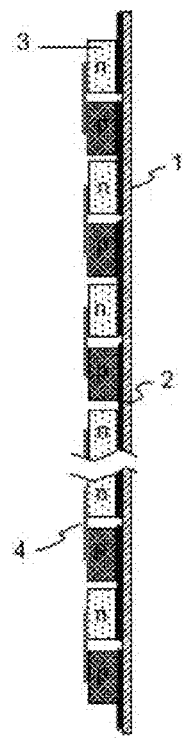
FIG. 30 shows the thermoelectric conversion module of the known art.
Figure 31:
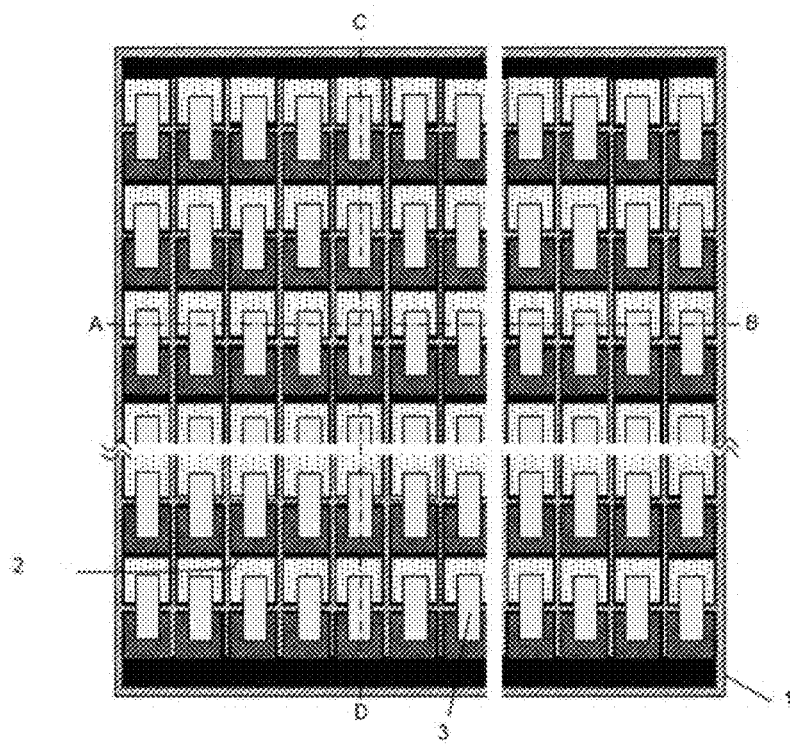
FIG. 31 shows the thermoelectric conversion module of the known art.
Figure 32:
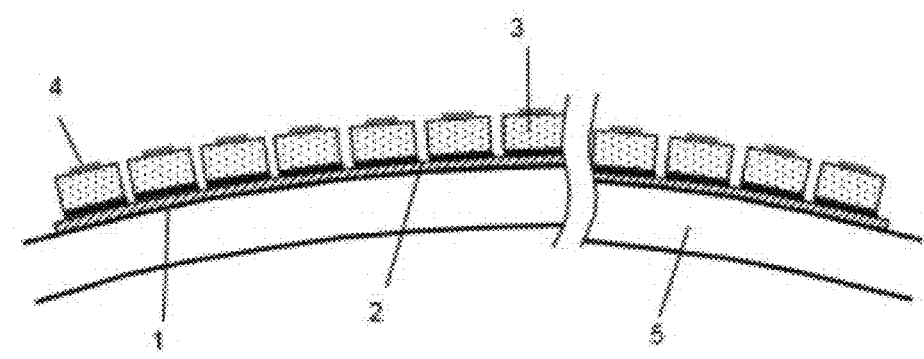
FIG. 32 shows the thermoelectric conversion module and the thermoelectric power generation system of the known art.
Figure 33:
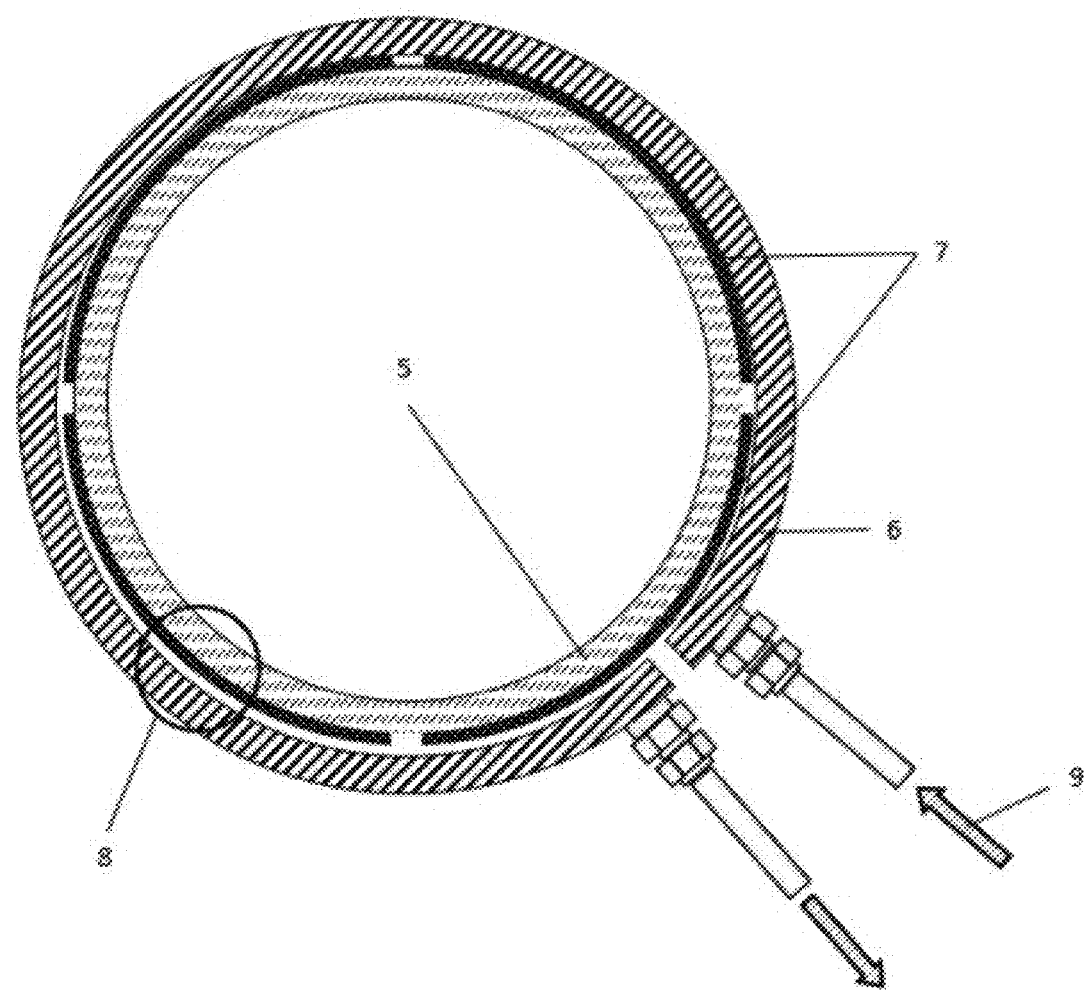
FIG. 33 shows a thermoelectric conversion module and a thermoelectric power generation system of the known art.

FIG. 28 shows an embodiment of a method for producing the thermoelectric power generation system of the present invention. For producing the thermoelectric power generation system, a thermoelectric conversion module 24 is bonded to the cooling pipes 34 in advance. The thermoelectric power generation system is then curved along the surface of an exhaust heat pipe, and is brought into contact with, and fixed to, the exhaust heat pipe. According to this method, at least the thermoelectric conversion module 24 and the cooling pipes 34 are fixed. Thus, this method makes it possible to stably keep the thermal resistance between the thermoelectric conversion module 24 and the cooling pipes 34 low, and allows the thermoelectric power generation system to be mounted to the exhaust heat pipe easily and stably.

Although FIG. 28 shows a method for producing the thermoelectric power generation system of the second embodiment including the cooling pipes, the thermoelectric power generation system of the first embodiment including the heat dissipation fins may be produced by the same or similar method, and the same advantages as those described above can be provided.

INDUSTRIAL APPLICABILITY

The present invention, which relates to a thermoelectric conversion module which interconverts heat (a temperature differential) and electricity, and in particular, to a power generation module, a method for producing the module, and a thermoelectric power generation system using the module, is useful in any place where heat can be utilized efficiently.

DESCRIPTION OF REFERENCE CHARACTERS

10: Flexible Substrate
11: Thermoelectric Element
11a: P-Type Thermoelectric Element
11b: N-Type Thermoelectric Element
13: Flexible Substrate
14: Slit
16: Mounting Land
17: Conductive Paste
18: Solder Resist
19: Thermally Conductive Sheet
20: Exhaust Heat Pipe
21: Cooling Water Pipe
22: Clasp
24: Thermoelectric Conversion Module
28: Heat Dissipation Fin
29: Thermally Conductive Sheet
30: Thermally-Conductive Flexible Substrate
31: Thermally Conductive Sheet
32: Fixing Band
33: Highly Thermally Insulating Spacer.
34: Cooling Pipe
35: Flexible Sheet
36: Coupling
38: Metal Sheet

The invention claimed is:
1. A thermoelectric conversion module configured to be wrapped around a heat source having a curved surface, the thermoelectric conversion module comprising:
two flexible substrates each made of a resin thin film, having mounting lands formed thereon, and configured to be bent along the curved surface when the thermoelectric conversion module is wrapped; and
a plurality of thermoelectric elements mounted on the mounting lands, wherein
the plurality of the thermoelectric elements are arranged in a first direction perpendicular to a thickness direction of each of the two flexible substrates and in a second direction perpendicular to both the first direction and the thickness direction,
the plurality of the thermoelectric elements include a plurality of p-type thermoelectric elements and a plurality of n-type thermoelectric elements,
the plurality of p-type thermoelectric elements and the plurality of n-type thermoelectric elements are arranged alternately in line with each other and electrically connected, via the mounting lands, in series in the first direction, and
in a state where the thermoelectric conversion module is wrapped around the heat source, one of the two flexible substrates that is adjacent to the heat source constitutes a heat source-side substrate, and the other one that is separated from the heat source constitutes an outer substrate, the outer substrate is free from electrical connectors extending between the p-type thermoelectric elements and the n-type thermoelectric elements in the second direction, and only the outer substrate has therein a plurality of slits, between the plurality of thermoelectric elements neighboring in the second direction, extending in parallel with the first direction.

2. The thermoelectric conversion module of claim 1, wherein the mounting lands of the two flexible substrates connect the thermoelectric elements via solder, thereby reducing electric resistance and improving thermoelectric conversion efficiency.

3. The thermoelectric conversion module of claim 1, wherein a thermally conductive sheet is provided on an outer surface of at least the heat source-side substrate of the two flexible substrates, and the thermally conductive sheet is in contact with an exhaust heat pipe, thereby efficiently transmitting heat from the exhaust heat pipe.

4. The thermoelectric conversion module of claim 1, wherein each flexible substrate has metal provided on each of both surfaces in a thickness direction of the flexible substrate, and the metal on one of the both surfaces is connected to the metal on the other, thereby reducing thermal resistance.

5. The thermoelectric conversion module of claim 1, wherein the heat source is a pipe, and when the thermoelectric conversion module is wrapped around the pipe, the plurality of slits extends along an axis of the pipe.

6. The thermoelectric conversion module of claim 1, wherein consecutive p-type thermoelectric elements and consecutive n-type thermoelectric elements are arranged in alternating rows parallel with the second direction.

* * * * *